(12) United States Patent
Ye et al.

(10) Patent No.: US 12,193,253 B2
(45) Date of Patent: Jan. 7, 2025

(54) LIGHT EMITTING DEVICE AND DISPLAY APPARATUS INCLUDING THE SAME

(71) Applicant: Samsung Display Co., Ltd., Yongin-si (KR)

(72) Inventors: Jimyoung Ye, Suwon-si (KR); Seulong Kim, Cheonan-si (KR); Hyekyun Lee, Seoul (KR); Hajin Song, Hwaseong-si (KR); Jihwan Yoon, Yongin-si (KR); Dongseob Jeong, Suwon-si (KR); Jaehoon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 17/575,583

(22) Filed: Jan. 13, 2022

(65) Prior Publication Data

US 2022/0336766 A1 Oct. 20, 2022

(30) Foreign Application Priority Data

Apr. 8, 2021 (KR) .................. 10-2021-0045692

(51) Int. Cl.
*H10K 50/13* (2023.01)
*H10K 50/11* (2023.01)
(Continued)

(52) U.S. Cl.
CPC ........... *H10K 50/131* (2023.02); *H10K 50/11* (2023.02); *H10K 50/19* (2023.02); *H10K 59/122* (2023.02);
(Continued)

(58) Field of Classification Search
CPC .................................................. H10K 2101/90
See application file for complete search history.

(56) References Cited

U.S. PATENT DOCUMENTS 7,649,211 B2  1/2010  Ohsawa
10,115,924 B2  10/2018  Kum et al.
(Continued)

FOREIGN PATENT DOCUMENTS

KR  10-2017-0034173 A  3/2017
KR  10-1711596 B1  3/2017
(Continued)

OTHER PUBLICATIONS

Young, Barry (2020), "QD-OLED Production to Start without Endorsement of Samsung Visual", OLED Association, Aug. 2, 2020, Musing-Weekly Newsletter (5 pages); https://www.oled-a.org/qd-oled-production-to-start-withoutendorsement-of-samsung-visual_8220.html.

(Continued)

*Primary Examiner* — Yu-Hsi D Sun
(74) *Attorney, Agent, or Firm* — Lewis Roca Rothgerber Christie LLP

(57) ABSTRACT

A light emitting devices includes a first electrode, a hole transport region on the first electrode, a first emission layer on the hole transport region, the first emission layer to emit light of a first wavelength, a second emission layer on the hole transport region and to emit light of a second wavelength, an electron transport region on the first and second emission layers, and a second electrode on the electron transport region. The first emission layer includes a first sub-emission layer including a first hole transport host and a first sub-dopant to emit the light of the first wavelength, and a second sub-emission layer including a first electron transport and a second sub-dopant to emit the light of the first wavelength. The second emission layer includes a second hole transport host, a second electron transport host, and a second dopant to emit the light of the second wavelength.

20 Claims, 10 Drawing Sheets

(51) Int. Cl.
  *H10K 50/19* (2023.01)
  *H10K 59/122* (2023.01)
  *H10K 59/38* (2023.01)
  *H10K 101/00* (2023.01)
  *H10K 101/10* (2023.01)

(52) U.S. Cl.
  CPC ......... *H10K 59/38* (2023.02); *H10K 2101/10* (2023.02); *H10K 2101/90* (2023.02)

(56) References Cited

U.S. PATENT DOCUMENTS

| | | | |
|---|---|---|---|
| 10,790,337 | B2 | 9/2020 | Jeong et al. |
| 11,005,059 | B2* | 5/2021 | Lee ..................... H10K 59/122 |
| 11,158,831 | B2 | 10/2021 | Lee et al. |
| 2017/0077434 | A1 | 3/2017 | Kim et al. |
| 2017/0155070 | A1 | 6/2017 | Han et al. |
| 2019/0348640 | A1 | 11/2019 | Kim et al. |
| 2021/0175457 | A1* | 6/2021 | Park ....................... H10K 59/38 |
| 2023/0217669 | A1* | 7/2023 | Cho ....................... H10K 50/12 257/40 |

FOREIGN PATENT DOCUMENTS

| | | |
|---|---|---|
| KR | 20170040418 A | 4/2017 |
| KR | 10-2018-0025049 A | 3/2018 |
| KR | 10-2018-0078637 A | 7/2018 |
| KR | 10-2019-0000759 A | 1/2019 |
| KR | 20190003151 A | 1/2019 |
| KR | 20200103235 A | 9/2020 |

OTHER PUBLICATIONS

Zheng, Tianhang et al., "High-efficiency blue fluorescent organic light emitting devices based on double emission layers", J. Phys. D Appl. Phys. 41 (2008) 055103 (6 pages).

* cited by examiner

LIGHT EMITTING DEVICE AND DISPLAY APPARATUS INCLUDING THE SAME

CROSS-REFERENCE TO RELATED APPLICATION

This application claims priority to and the benefit of Korean Patent Application No. 10-2021-0045692, filed on Apr. 8, 2021 in the Korean Intellectual Property Office, the entire content of which is hereby incorporated by reference.

BACKGROUND

One or more aspects of embodiments of the present disclosure relate to a light emitting device and a display apparatus including the same, and more particularly, to a light emitting device having increased luminous efficiency and device lifespan and a display apparatus including the same.

An organic light emitting device is a self-luminous device having a relatively short response time and driven by a relatively low voltage. Therefore, an organic light emitting display apparatus including the organic light emitting device may be configured such that a separate light source may be omitted to achieve lightness and thinness and also to have numerous advantages such as excellent brightness and/or viewing angle independence.

The light emitting device may be a display element that includes an emission layer made of an organic material between an anode electrode and a cathode electrode. Holes provided from the anode electrode and electrons provided from the cathode electrode are combined with each other in the emission layer to form excitons, and then the excitons generate light that corresponds to the energy between the holes and the electrons.

A tandem organic light emitting device has a structure that includes two or more stacks of hole transport layer/emission layer/electron transport layer, and the stacks have therebetween a charge generation layer that assists generation and movement of charges.

SUMMARY

One or more aspects of embodiments of the present disclosure are directed toward a light emitting device having increased luminous efficiency and device lifespan.

One or more aspects of embodiments of the present disclosure are directed toward a display apparatus having increased display efficiency.

According to one or more embodiments of the present disclosure, a light emitting device may comprise: a first electrode; a hole transport region on the first electrode; a first emission layer on the hole transport region, the first emission layer being to emit light of a first wavelength; a second emission layer on the hole transport region, the second emission layer being to emit light of a second wavelength different from the first wavelength; an electron transport region on the first emission layer and the second emission layer; and a second electrode on the electron transport region. The first emission layer may include: a first sub-emission layer including a first hole transport host and a first sub-dopant, the first sub-emission layer being to emit the light of the first wavelength; and a second sub-emission layer including a first electron transport host different from the first hole transport host and a second sub-dopant, the second sub-emission layer being to emit the light of the first wavelength. The second emission layer may include a second hole transport host, a second electron transport host, and a second dopant, the second emission layer being to emit the light of the second wavelength.

In one or more embodiments, the first wavelength may be in a range from about 420 nm to about 480 nm. The second wavelength may be in a range from about 520 nm to about 600 nm.

In one or more embodiments, the light emitting device may further comprise a first charge generation layer between the first emission layer and the second emission layer.

In one or more embodiments, the first charge generation layer may include: a first p-type charge generation layer doped with a p-type dopant; and a first n-type charge generation layer doped with an n-type dopant.

In one or more embodiments, the light emitting device may further comprise an additional emission layer between the hole transport region and the electron transport region. The additional emission layer may be to emit the light of the first wavelength.

In one or more embodiments, the additional emission layer may include: a first additional emission layer between the first emission layer and the second emission layer; and a second additional emission layer between the first additional emission layer and the second emission layer.

In one or more embodiments, the first additional emission layer may include: a third sub-emission layer including a second hole transport host and a third sub-dopant, the third sub-emission layer being to emit the light of the first wavelength; and a fourth sub-emission layer including a second electron transport host different from the second hole transport host and a fourth sub-dopant, the fourth sub-emission layer being to emit the light of the first wavelength.

In one or more embodiments, the additional emission layer may further include a third additional emission layer between the second electrode and the second emission layer. The third additional emission layer may be to emit the light of the first wavelength.

In one or more embodiments, the second emission layer may be disposed between the first emission layer and the second electrode.

In one or more embodiments, the hole transport region may include a hole injection layer on the first electrode and a hole transport layer on the hole injection layer. The electron transport region may include an electron transport layer on the first and second emission layers and an electron injection layer on the electron transport layer.

In one or more embodiments, the light emitting device may further comprise a capping layer on the second electrode. A refractive index of the capping layer may be equal to or greater than about 1.6.

In one or more embodiments, each of the first and second sub-dopants may be a fluorescent dopant. The second dopant may be a phosphorescent dopant.

In one or more embodiments, the first sub-emission layer and the second sub-emission layer may be in contact with each other.

In one or more embodiments, the light emitting device may further comprise: a middle electron transport layer on the second sub-emission layer; and a middle hole transport layer between the first emission layer and second emission layer.

According to one or more embodiments of the present disclosure, a light emitting device may comprise: a first electrode; a hole transport region on the first electrode; a plurality of first emission layers on the hole transport region, the plurality of first emission layers being to emit light of a first wavelength; a second emission layer on the hole transport region, the second emission layer being to emit light of a second wavelength different from the first wavelength; an electron transport region on the first emission layer and the second emission layer; and a second electrode on the electron transport region. The plurality of first emission layers may include a first first-emission layer, a second first-emission layer, and a third first-emission layer. At least one selected from the first first-emission layer, the second first-emission layer, and the third first-emission layer may include: a first sub-emission layer including a first hole transport host and a first sub-dopant, the first sub-emission layer being to emit the light of the first wavelength; and a second sub-emission layer including a first electron transport host different from the first hole transport host and a second sub-dopant, the second sub-emission layer being to emit the light of the first wavelength.

In one or more embodiments, the second emission layer may include a second hole transport host, a second electron transport host, and a second dopant, the second emission layer being to emit the light of the second wavelength.

In one or more embodiments, the first wavelength may be in a range from about 420 nm to about 480 nm. The second wavelength may be in a range from about 520 nm to about 600 nm.

According to one or more embodiments of the present disclosure, a display apparatus may comprise: a substrate including a first pixel region to emit light of a first wavelength, a second pixel region to emit light of a second wavelength different from the first wavelength, and a third pixel region to emit light of a third wavelength different from the first and second wavelengths; and a plurality of light emitting devices on the substrate and overlapping the first pixel region, the second pixel region, and the third pixel region. Each of the plurality of light emitting devices may include: a first electrode; a hole transport region on the first electrode; a first emission layer on the hole transport region and being to emit the light of the first wavelength; a second emission layer on the hole transport region and being to emit the light of the second wavelength; an electron transport region on the first emission layer and the second emission layer; and a second electrode on the electron transport region. The first emission layer may include: a first sub-emission layer including a first hole transport host and a first sub-dopant, the sub-emission layer being to emit the light of the first wavelength; and a second sub-emission layer including a first electron transport host different from the first hole transport host and a second sub-dopant, the second sub-emission layer being to emit the light of the first wavelength. The second emission layer may include a second hole transport host, a second electron transport host, and a second dopant, the second emission layer being to emit the light of the second wavelength.

In one or more embodiments, the display apparatus may further comprise a light control layer on the plurality of light emitting devices. The light control layer may include: a first light control part that overlaps the first pixel region and to transmit the light of the first wavelength; a second light control part that overlaps the second pixel region and to transmit the light of the second wavelength; and a third light control part that overlaps the third pixel region and to transmit the light of the third wavelength.

In one or more embodiments, the substrate may further include a fourth pixel region to emit white light. The light control layer may further include a transmission part that overlaps the fourth pixel region and to transmit the white light.

DETAILED DESCRIPTION

Figure 1:
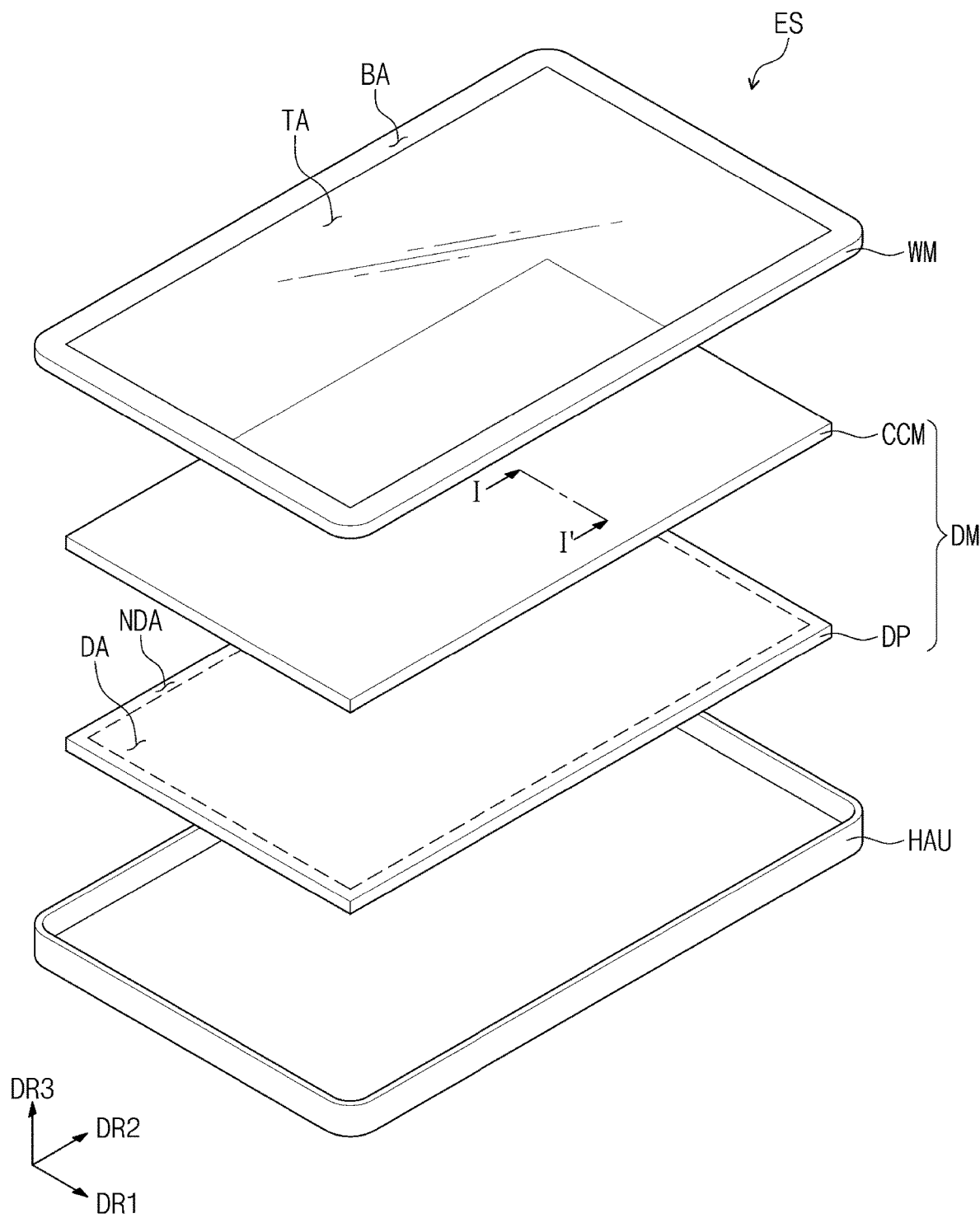
FIG. 1 illustrates an exploded perspective view showing a display apparatus according to one or more embodiments of the present disclosure.

In this description, when a certain component (or region, layer, portion, etc.) is referred to as being "on", "connected to", or "coupled to" other component(s), the certain component may be directly on, directly connected to, or directly coupled to the other component(s) (without any intervening components therebetween) or at least one intervening component may be present therebetween.

Like numerals indicate like components. Moreover, in the drawings, thicknesses, ratios, and dimensions of components are exaggerated for effectively explaining the technical contents. The term "and/or" includes one or more combinations defined by associated components. Further, the use of "may" when describing embodiments of the present disclosure refers to "one or more embodiments of the present disclosure".

It will be understood that, although the terms first, second, etc. may be used herein to describe various components, these components should not be limited by these terms. These terms are only used to distinguish one component from another component. For example, a first component could be termed a second component, and vice versa without departing from the scope of the present disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The following will now describe a display apparatus and a light emitting device according to one or more embodiments of the present disclosure.

Figure 2:
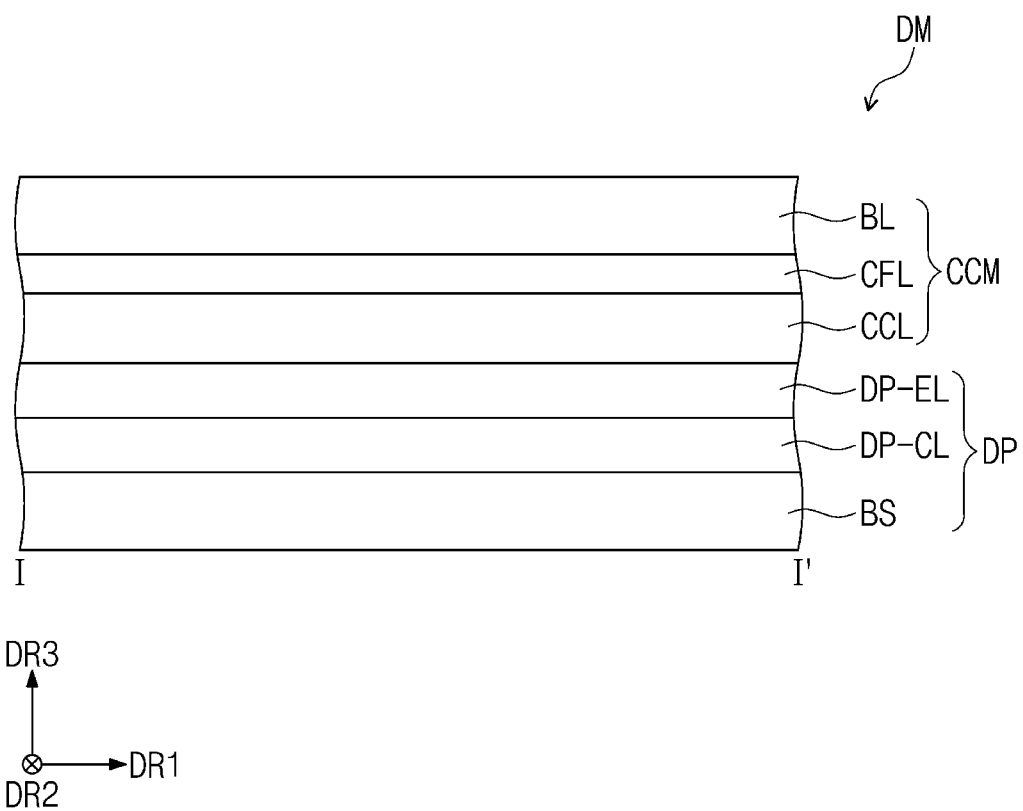
FIG. 2 illustrates a cross-sectional view showing a display module according to one or more embodiments of the present disclosure.

FIG. 1 illustrates an exploded perspective view showing a display apparatus according to one or more embodiments of the present disclosure. FIG. 2 illustrates a cross-sectional view showing a display module according to one or more embodiments of the present disclosure. FIG. 2 shows a cross-section taken along line I-I' of FIG. 1.

In one or more embodiments, a display apparatus ES may be a large-sized display apparatus for televisions, monitors, and/or outdoor billboards. In addition, the display apparatus ES may be a small and/or medium-sized display apparatus for personal computers, laptop computers, personal digital terminals, automotive navigation units, game consoles, smart phones, tablet computers, and/or cameras. These items are merely presented as examples, and the display apparatus ES may be adopted for any other suitable display apparatus so long as it does not depart from the spirit of the present disclosure.

The display apparatus ES according to one or more embodiments may include a window WM, a display module DM, and a housing HAU. The display module DM may include a display panel DP. In one or more embodiments, the display apparatus ES may include one or more suitable devices which are activated based on electric signals, such as a touch element and/or a detection element, other than the display element.

The following figures including FIG. 1 show first, second, and third directions DR1, DR2, and DR3, and in this description, directions indicated by the first to third directional directions DR1 to DR3 are relative concepts and may thus be changed to other directions.

In this description, the third direction DR3 is defined to refer to a direction along which an image is provided to users. In addition, the first direction DR1 and the second direction DR2 may intersect each other, and the third direction DR3 may be a normal direction to a plane defined by the first direction DR1 and the second direction DR2 (e.g., a plan view). In FIG. 1, an image may be provided on a plane defined by the first direction DR1 and the second direction DR2.

For the display apparatus ES according to one or more embodiments, the window WM may be disposed (e.g., positioned and/or provided) on the display module DM. The window WM may include a material including glass, sapphire, and/or plastic. The window WM may include a transmission region TA which transmits an image provided from the display module DM, and may also include a shield region BA which is adjacent to the transmission region TA and through which no image passes. In one or more embodiments, the window WM may be omitted from (not provided with) the display apparatus ES according to one or more embodiments.

For the display apparatus ES according to one or more embodiments, the display module DM may be disposed below the window WM. The display module DM may include a display panel DP and a light control member CCM disposed on the display panel DP.

The display panel DP may be an emissive display panel. For example, the display panel DP may be a light emitting diode (LED) display panel, an organic electroluminescence display panel, or a quantum-dot light emitting display panel. The present disclosure, however, is not limited thereto.

The light emitting diode (LED) display panel may include a light emitting diode, an emission layer of the organic electroluminescence display panel may include an organic electroluminescent material, and an emission layer of the quantum-dot light emitting display panel may include a quantum dot or a quantum rod. The following description will focus on an organic electroluminescence display panel adopted as the display panel DP included in the display apparatus ES according to one or more embodiments of the present disclosure. The present disclosure, however, is not limited to that discussed above.

The display apparatus ES according to one or more embodiments may include the display panel DP and the light control member CCM disposed on the display panel DP, and may be an organic electroluminescence display apparatus including an organic electroluminescence display panel. The display panel DP may provide a first light having a set certain wavelength. For example, the display panel DP may provide blue light as the first light. However, the present disclosure is not limited thereto, and the display panel DP may emit white light.

The light control member CCM may change the wavelength of the first light provided from the display panel DP or may transmit the first light provided from the display panel DP.

When viewed in plane (e.g., in plan view), the display panel DP may display an image on its one side that is defined as a display surface. The display surface includes a display region DA on which an image is displayed and a non-display region NDA on which no image is displayed. When viewed in a plan view, the display region DA may be defined at a center of the display panel DP, and may overlap the transmission region TA of the window WM.

The housing HAU may be disposed below the display panel DP and may accommodate the display panel DP. The housing HAU may cover the display panel DP so as to expose the display surface, or a top surface, of the display panel DP. The housing HAU may expose an entirety of the top surface of the display panel DP, while covering lateral and bottom surfaces of the display panel DP.

Referring to FIG. 2, the display panel DP may include a base substrate BS, a circuit layer DP-CL disposed on the base substrate BS, and a display element layer DP-EL disposed on the base substrate BS. In one or more embodiments, the base substrate BS, the circuit layer DP-CL, and the display element layer DP-EL may be sequentially stacked along the third direction DR3.

The base substrate BS may be a member that provides a base surface on which the display element layer DP-EL is disposed. The base substrate BS may be a glass substrate, a metal substrate, and/or a plastic substrate. The present disclosure, however, is not limited thereto, and the base substrate BS may be an inorganic layer, an organic layer, or a composite material layer (e.g., including an organic material and an inorganic material).

In one or more embodiments, the circuit layer DP-CL may be disposed on the base substrate BS, and may include a plurality of transistors. The transistors may each include a control electrode, an input electrode, and an output electrode. For example, the circuit layer DP-CL may include a switching transistor and a driving transistor that drive an organic electroluminescence display apparatus (see e.g., ED of FIG. 4A) of the display element layer DP-EL.

The light control member CCM may be disposed on the display panel DP. The light control member CCM may include a light control layer CCL, a color filter layer CFL, and an upper base layer BL. For example, the display panel DP may include a light emitting device (see e.g., ED of FIG. 4A), and the light control member CCM may include a light control layer (see e.g., CCL of FIG. 4A) that changes a wavelength of light provided from the light emitting device (see e.g., ED of FIG. 4A) or that allows light to pass therethrough.

Figure 3:
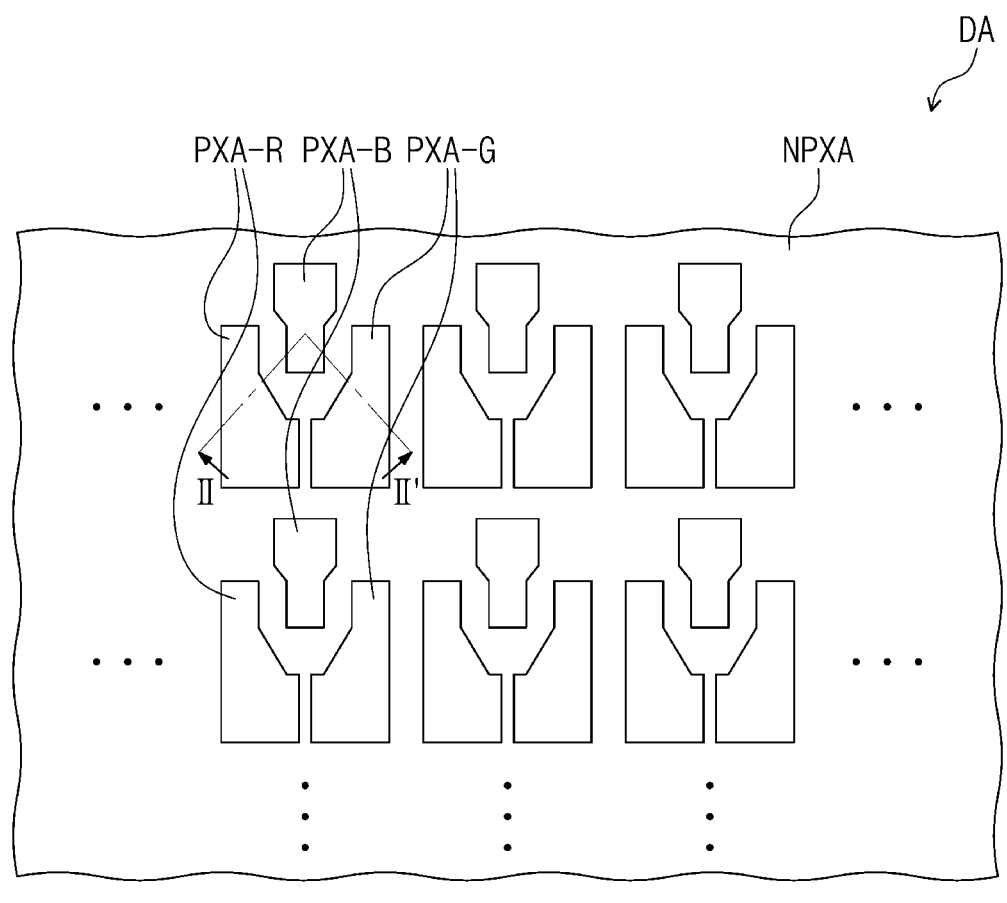
FIG. 3 illustrates an enlarged plan view partially showing a display panel included in a display apparatus according to one or more embodiments of the present disclosure.
Figure 3:
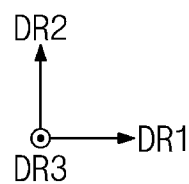
Figure 4A:
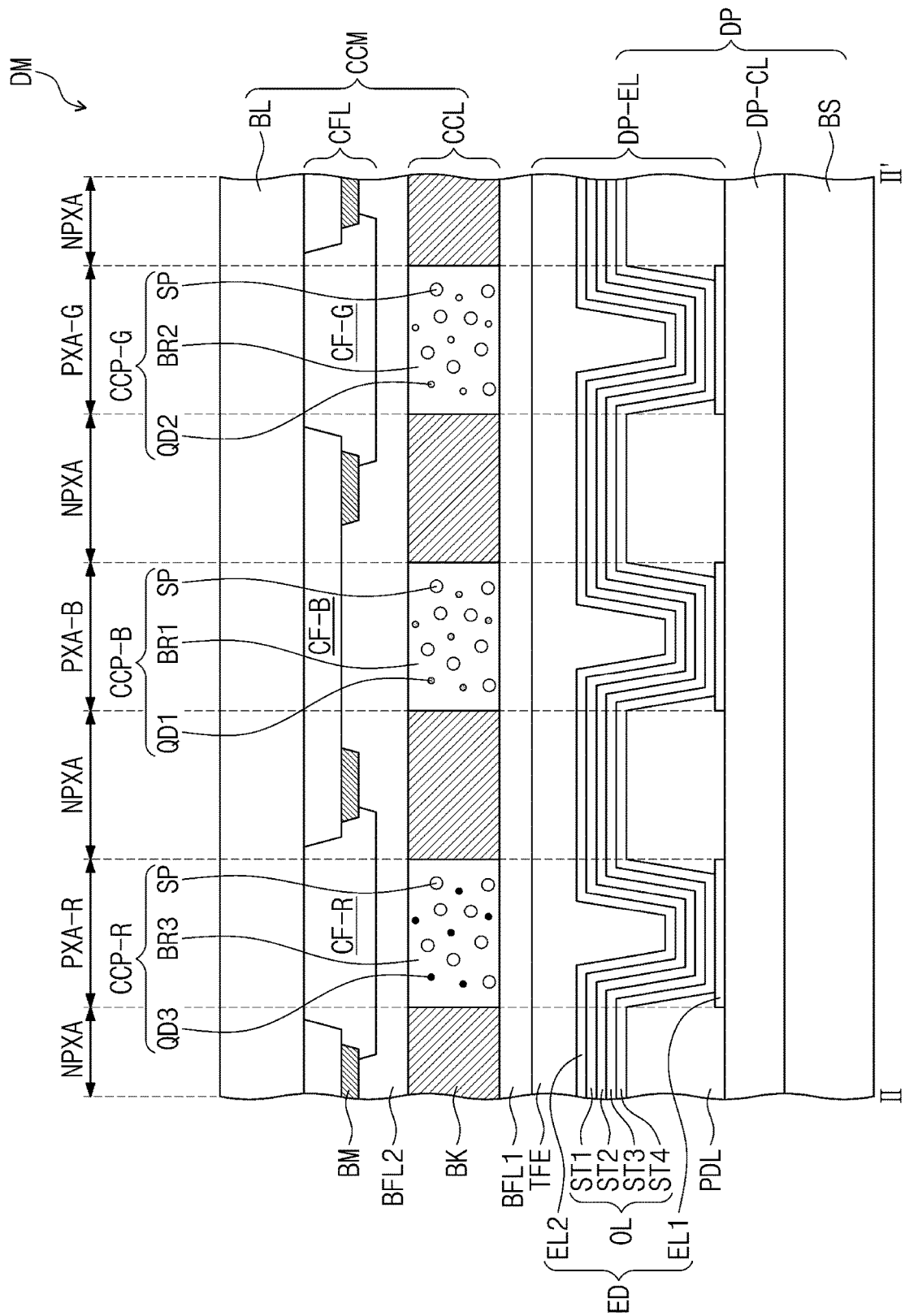
FIGS. 4A-4C illustrate enlarged cross-sectional views partially showing a display module included in a display apparatus according to one or more embodiments of the present disclosure.
Figure 4B:
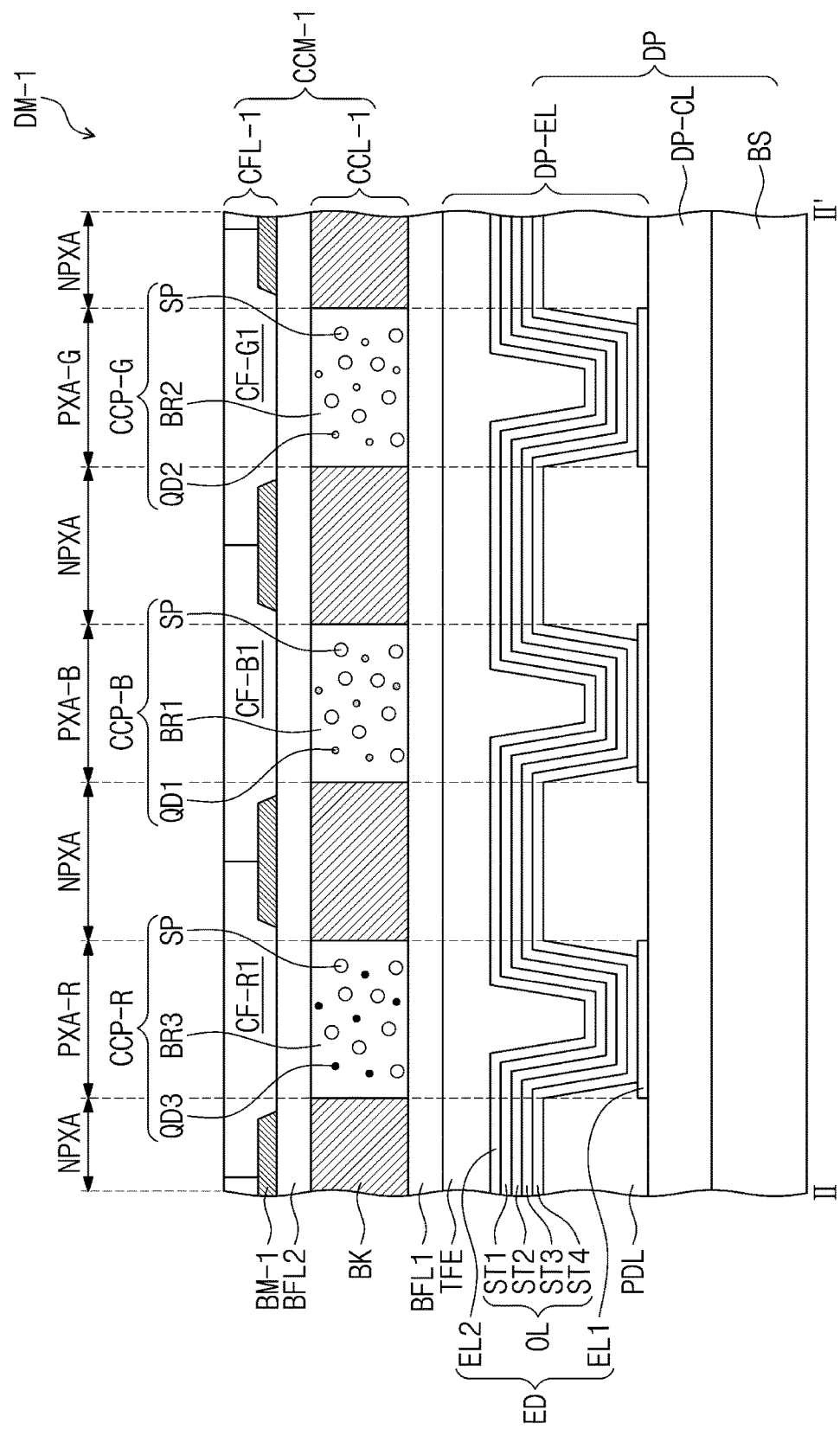
Figure 4C:
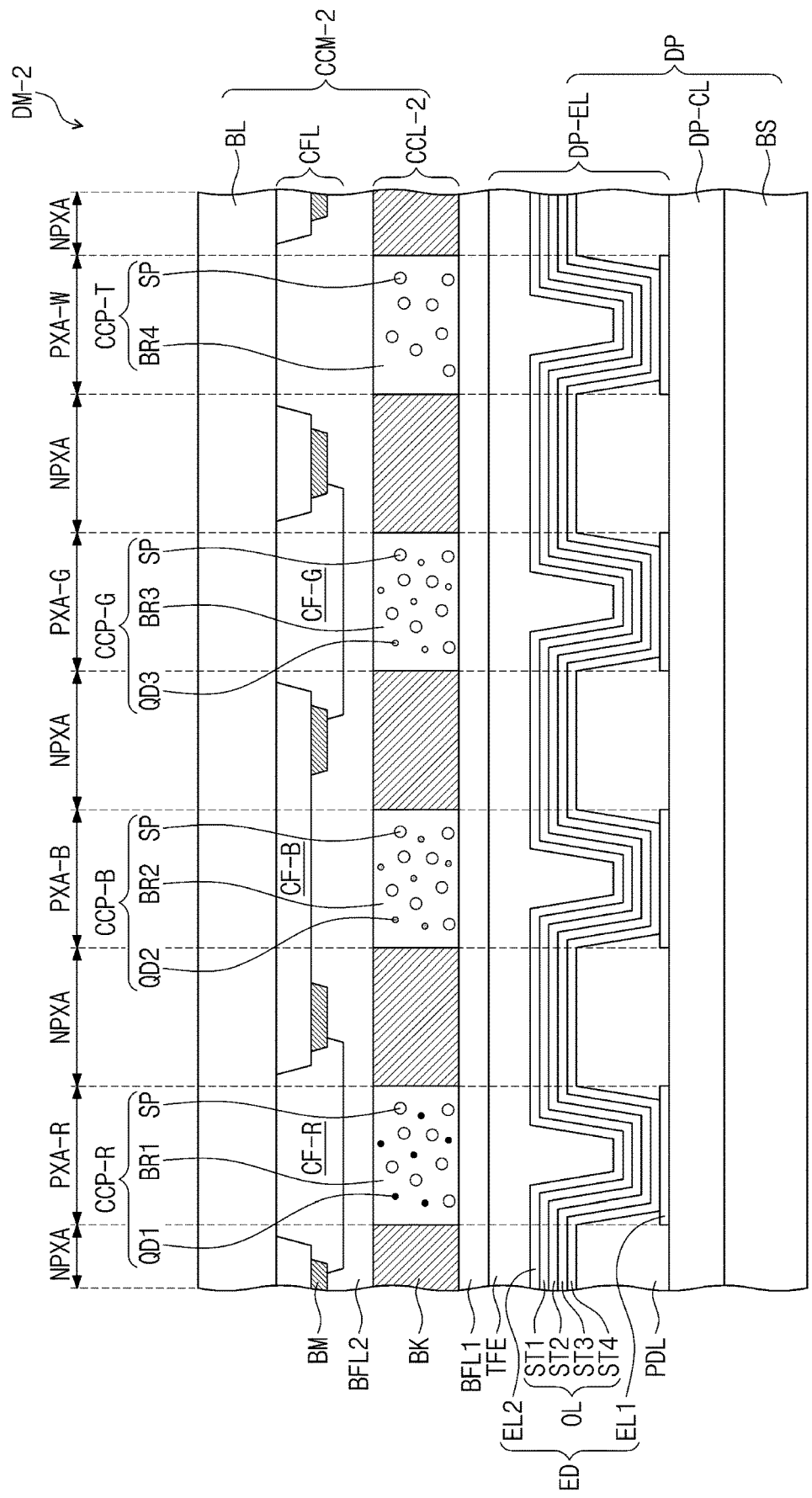

FIG. 3 illustrates an enlarged plan view partially showing a display panel included in a display apparatus according to one or more embodiments of the present disclosure. FIGS. 4A to 4C illustrate enlarged cross-sectional views partially showing a display module included in a display apparatus according to one or more embodiments of the present disclosure. FIG. 3 shows a portion of the display region DA of a display panel according to one or more embodiments of the present disclosure. FIGS. 4A and 4B show cross-sectional views taken along line II-II' of FIG. 3. FIG. 4C shows a cross-sectional view that corresponds to the cross-section of FIG. 4A, showing a display module according to one or more other embodiments.

The display apparatus ES of FIG. 1 according to one or more embodiments may include one of display modules DM, DM-1, and DM-2 according to one or more embodiments discussed with reference to FIGS. 3, 4A, 4B, and 4C, and each of the display modules DM, DM-1, and DM-2 may include a display panel DP and a light control member CCM.

The display module DM according to one or more embodiments may include a display panel DP and a light control member CCM disposed on the display panel DP, and the light control member CCM may include a light control layer CCL and a color filter layer CFL. The light control member CCM may include an upper base layer BL, a light control layer CCL disposed below the upper base layer BL, and a color filter layer CFL disposed between the light control layer CCL and the upper base layer BL. The light control member CCM may be configured such that the light control layer CCL may be disposed adjacent to the display panel DP.

The light control member CCM may include a plurality of partition walls BK and a plurality of light control parts CCP-R, CCP-B, and CCP-G disposed between adjacent partition walls BK.

Referring to FIGS. 3, 4A, and 4B, the display module DM may include non-pixel regions NPXA and pixel regions PXA-R, PXA-B, and PXA-G. Each of the pixel regions PXA-R, PXA-B, and PXA-G may be a zone to emit light generated from the light emitting device ED. The pixel regions PXA-R, PXA-B, and PXA-G may have different areas from each other, where each of the areas may refer to an area when viewed in plane (e.g., in plan view).

The pixel regions PXA-R, PXA-B, PXA-G may be classified into a plurality groups according to the color of light emitted therefrom. FIGS. 3, 4A, and 4B show by way of example that the display module DM may include three pixel regions PXA-R, PAX-B, and PXA-G to emit red light, blue light, and green light, respectively. For example, the display apparatus (see ES of FIG. 1) according to one or more embodiments may include a red pixel region PXA-R, a blue pixel region PXA-B, and a green pixel region PXA-G. The red pixel region PXA-R may emit light whose light emitting wavelength is in a range from about 620 nm to about 700 nm, the blue pixel region PXA-B may emit light whose light emitting wavelength is in a range from about 410 nm to about 480 nm, and the green pixel region PXA-G may emit light whose light emitting wavelength is in a range from about 500 nm to about 600 nm.

FIGS. 4A and 4B show the display modules DM and DM-1 according to one or more embodiments in each of which the display panel DP includes a light emitting device ED inclusive of an organic layer OL as a common layer. For the display modules DM and DM-1 according to one or more embodiments shown in FIGS. 4A and 4B, the display panel DP may emit the same light regardless of the pixel regions PXA-R, PXA-B, and PXA-G of the display module DM. For example, the display panel DP may provide the light control member CCM with blue light as the first light. For another example, the display panel DP may provide the light control member CCM with white light as the first light.

In one or more embodiments, in the display modules DM and DM-1, the red and green pixel regions PXA-R and PXA-G among the pixel regions PXA-R, PXA-B, and PXA-G may have the same area, and the blue pixel region PXA-B may have an area less than that of the red and green pixel regions PXA-R and PXA-G. The present disclosure, however, is not limited thereto, and the pixel regions PXA-R, PXA-B, and PXA-G may have the same area, or may have different areas based on colors emitted from the light control parts CCP-R, CCP-B, and CCP-G. For example, the display module DM according to one or more embodiments may be configured such that the blue pixel region PXA-B may have the largest area, and the green pixel region PXA-G may have the smallest area. The present disclosure, however, is not limited thereto, and the pixel regions PXA-R, PXA-B, and PXA-G may each emit light other than red light, blue light, and green light, or may be provided to have different area ratios from each other.

The pixel regions PXA-R, PXA-B, and PXA-G may be zones that are distinguished from each other by a pixel definition layer PDL. Each of the non-pixel regions NPXA may be a zone that is between neighboring ones of the pixel regions PXA-R, PXA-B, and PXA-G and that corresponds to the pixel definition layer PDL.

As shown in FIG. 3, among the pixel regions PXA-R, PXA-B, and PXA-G, the red and green pixel regions PXA-R and PXA-G may be arranged to form a symmetrical shape about a reference axis that extends in the second direction DR2, and the blue pixel region PXA-B may be disposed between the red pixel region PXA-R and the green pixel region PXA-G. When viewed in the first direction DR1, no portion of the blue pixel region PXA-B may overlap either the red pixel region PXA-R or the green pixel region PXA-G. The present disclosure, however, is not limited thereto, and the pixel regions PXA-R, PXA-B, and PXA-G may have a polygonal shape, a circular shape, or any other suitable shape, and no limitation is imposed on the arrangement of the pixel regions PXA-R, PXA-B, and PXA-G. For example, a stripe structure may be formed in which the blue pixel region PXA-B, the green pixel region PXA-G, and the red pixel region PXA-R are sequentially and alternately arranged with each other, and the arrangement of the pixel regions PXA-R, PXA-B, and PXA-G may have a PenTile®/PENTILE® structure (PENTILE® is a registered trademark owned by Samsung Display Co., Ltd.).

Referring to FIGS. 4A to 4C, the display panel DP according to one or more embodiments may include a base substrate BS, a circuit layer DP-CL disposed on the base substrate BS, and a display element layer DP-EL disposed on the circuit layer DP-CL. The display element layer DP-EL may include a pixel definition layer PDL, a light emitting device ED disposed between the pixel definition layers PDL, and a thin-film encapsulation layer TFE disposed on the light emitting device ED.

The pixel definition layer PDL may be formed of a polymer resin. For example, the pixel definition layer PDL may be formed of a polyacrylate-based resin and/or a polyimide-based resin. The pixel definition layer PDL may be formed of a polymer resin and an inorganic material. The pixel definition layer PDL may be formed of a light-absorbing material, a black pigment, and/or a black dye. The pixel definition layer PDL may be formed of an inorganic material. For example, the pixel definition layer PDL may be formed of silicon nitride (SiNx), silicon oxide (SiOx), and/or silicon oxynitride (SiOxNy). The pixel definition layer PDL may define the pixel regions PXA-R, PXA-B, and PXA-G. The pixel definition layer PDL may distinguish the pixel regions PXA-R, PXA-B, and PXA-G from the non-pixel region NPXA.

The pixel definition layer PDL may overlap the partition wall BK. For example, a plurality of pixel definition layers PDL may correspondingly overlap a plurality of partition walls BK in the third direction DR3.

The light emitting device ED may include a first electrode EL1, a second electrode EL2 that faces the first electrode EL1, and a plurality of organic layers OL disposed between the first electrode EL1 and the second electrode EL2. The plurality of organic layers OL of the light emitting device ED may include a plurality of stacks ST1, ST2, ST3, and ST4. Each of the stacks ST1, ST2, ST3, and ST4 may include functional layers including a hole transport material and an electron transport material, and may also include an emission layer including a light emitting material. For example, the light emitting device ED included in the display module DM according to one or more embodiments may have a tandem structure in which a plurality of emission layers are included. The following will describe in more detail each of the functional and emission layers included in the light emitting device ED.

FIGS. 4A and 4B depict embodiments in which each of the plurality of the stacks ST1, ST2, ST3, and ST4 included in the plurality of organic layers OL may be provided as a common layer provided in common on the non-pixel region NPXA and the pixel regions PXA-R, PXA-B, and PXA-G. For example, the stacks ST1, ST2, ST3, and ST4 included in the light emitting device ED have some portions disposed on the pixel definition layer PDL and other portions (i.e., remaining portions) disposed on the pixel regions PXA-R, PXA-B, and PXA-G, and the some and other portions of the stacks ST1, ST2, ST3, and ST4 may be connected (e.g., coupled or integrated) to form common layers. Therefore, the functional and emission layers included in the stacks ST1, ST2, ST3, and ST4 may also form common layers each of which has a substantially unitary shape on the non-pixel region NPXA and the pixel regions PXA-R, PXA-B, and PXA-G. The present disclosure, however, is not limited thereto, and in one or more embodiments, at least a portion of the stacks ST1, ST2, ST3, and ST4 may be patterned and provided in openings defined in the pixel definition layer PDL. An inkjet printing may be performed to pattern at least a portion of the stacks ST1, ST2, ST3, and ST4 or at least a portion of the functional and emission layers included in the stacks ST1, ST2, ST3, and ST4, and the patterned portion(s) may be provided within openings defined in the pixel definition layer PDL that overlap the pixel regions PXA-R, PXA-B, and PXA-G.

The light emitting device ED may be provided thereon with the thin-film encapsulation layer TFE disposed on the second electrode EL2. The thin-film encapsulation layer TFE may be directly disposed on the second electrode EL2. The thin-film encapsulation layer TFE may be a single layer or a plurality of stacked layers. The thin-film encapsulation layer TFE may include at least one dielectric layer. In one or more embodiments, the thin-film encapsulation layer TFE may include at least one inorganic layer (referred to hereinafter as an encapsulation inorganic layer). In one or more embodiments, the thin-film encapsulation layer TFE may include at least one organic layer (referred to hereinafter as an encapsulation organic layer) and at least one encapsulation inorganic layer.

The encapsulation inorganic layer may protect the light emitting device ED against moisture and/or oxygen, and the encapsulation organic layer may protect the light emitting device ED against foreign substances such as dust particles. The encapsulation inorganic layer may include silicon nitride, silicon oxynitride, silicon oxide, titanium oxide, and/or aluminum oxide, but the present disclosure is not particularly limited thereto. The encapsulation organic layer may include acrylic compound and/or epoxy compound. The encapsulation organic layer may include a photopolymerizable organic material, but the present disclosure is not particularly limited thereto.

A display apparatus according to one or more embodiments may include a light control member CCM disposed on the display panel DP. The light control member CCM may include an upper base layer BL and a light control layer CCL disposed below the upper base layer BL. The light control layer CCL may include a plurality of partition walls BK that are spaced apart from each other, and may also include a plurality of light control parts CCP-R, CCP-B, and CCP-G that are disposed between the partition walls BK. For example, in one or more embodiments, the light control member CCM may include an upper base layer BL, a plurality of partition walls BK disposed on the upper base layer BL, and a plurality of light control parts CCP-R, CCP-B, CCP-G disposed between the plurality of partition walls BK that are spaced apart from each other. FIG. 4A depicts by way of example that the upper base layer BL is separately provided to provide a reference surface on which the light control layer CCL is disposed, but the present disclosure is not limited thereto, and the light control layer CCL may be disposed on a reference surface provided from the thin-film encapsulation layer TFE of the display element layer DP-EL.

The light control member CCM according to one or more embodiments may include a plurality of light control parts CCP-R, CCP-B, and CCP-G. The light control parts CCP-R, CCP-B, and CCP-G may include a first light control part CCP-B that allows a first wavelength light to pass therethrough, a second light control part CCP-G that allows a second wavelength light to pass therethrough, and a third light control part CCP-R that allows a third wavelength light to pass therethrough. The second wavelength light may have a wavelength range longer than that of the first wavelength light, and the third wavelength light may have a wavelength range longer than that of the second wavelength range. For example, the first wavelength light may be blue light, the second wavelength light may be green light, and the third wavelength light may be red light. The first wavelength light may be light with emitting wavelength in a range from about 410 nm to about 480 nm, the second wavelength light may be light with light emitting wavelength in a range from about 500 nm to about 600 nm, and the third wavelength light may be light with light emitting wavelength in a range from about 620 nm to about 700 nm. The first wavelength light may be a source light that is provided from the display panel DP to the light control layer CCL.

Each of the first, second, and third light control parts CCP-B, CCP-G, and CCP-R may include a light emitting body. The light emitting body may be a particle that converts a wavelength of incident light to emit light of a different wavelength. In one or more embodiments, the light emitting body included in each of the second and third light control parts CCP-G and CCP-R may be a quantum dot or a fluorescent substance. The present disclosure, however, is not limited thereto. The first light control part CCP-B may be a transmission part that allows the first wavelength light to pass therethrough with no change in wavelength of the first wavelength light. The first light control part CCP-B may not include the light emitting body such as a quantum dot.

A quantum dot may be a particle that converts a wavelength of light provided thereto. A quantum dot core may be selected from II-I group compounds, III-V group compounds, IV-VI group compounds, IV group elements, IV group compounds, and any combinations thereof.

The II-VI group compound may include one or more selected from a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-VI group compound may include a binary compound such as $In_2S_3$ and/or $In_2Se_3$; a ternary compound such as $InGaS_3$ and/or $InGaSe_3$; or any combination thereof.

The I-III-VI group compound may include one or more selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and any mixture thereof; and a quaternary compound such as $AgInGaS_2$ and/or $CuInGaS_2$.

The III-V group compound may include one or more selected from a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The III-V group compound may further include II group metal. For example, InZnP may be selected as the III-II-V group compound.

The IV-VI group compound may include one or more selected from a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof.

The IV group element may be selected from the group consisting of Si, Ge, and any mixture thereof. The IV group compound may include a binary compound selected from the group consisting of SiC, SiGe, and any mixture thereof.

The binary, ternary, and/or quaternary compound(s) may be present at a uniform concentration in a particle, or may be present to have divided states at partially different concentrations in the same particle. In addition, the quantum dot may have a core/shell structure in which one quantum dot surrounds another quantum dot. An interface between the core and the shell may have a concentration gradient such that a concentration of an element present in the shell decreases along a direction approaching a center of the core.

In some embodiments, the quantum dot may have a core-shell structure in which a shell encloses a core including nano-crystal as described above. The shell of the quantum dot may serve as a protection layer which prevents or reduces chemical degeneration of the core to thereby maintain semiconductor characteristics and/or as a charging layer which provides the quantum dot with electrophoresis properties. The shell may be a single layer or a multiple layer. An interface between the core and the shell may have a concentration gradient such that a concentration of an element present in the shell decreases along a direction approaching a center of the core. The shell of the quantum dot may be, for example, metal oxide, non-metal oxide, a semiconductor compound, or any combination thereof.

For example, the metal oxide and the non-metal oxide may each independently be a binary compound such as $SiO_2$, $Al_2O_3$, $TiO_2$, ZnO, MnO, $Mn_2O_3$, $Mn_3O_4$, CuO, FeO, $Fe_2O_3$, Fe3O4, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof, but the present disclosure is not limited thereto.

The quantum dot may have a full width of half maximum (FWHM) of a light emission wavelength spectrum, which FWHM falls within a range of less than about 45 nm, narrowly less than about 40 nm, and more narrowly less than about 30 nm, and color purity and/or color reproducibility may improve in this range. In addition, light released through such quantum dot may be emitted in all directions, which may result in an improvement in viewing angle and/or may provide a wide viewing angle.

The quantum dot may have any suitable shape in the art, but the present disclosure is not limited thereto. For example, the quantum dot may have a shape of a sphere, pyramid, multi-arm, cubic nano-particle, nano-tube, nano-wire, nano-fiber, and/or nano-plate particle.

The quantum dot may adjust a color of emitted light depending on a particle size thereof, and thus may have various luminous colors such as blue, red, and/or green.

The smaller the particle size of the quantum dot, the shorter the wavelength of light emitted by the quantum dot. For example, the size of a quantum dot to emit green light may be less than that of a quantum dot to emit red light, and the size of a quantum dot to emit blue light may be less than that of a quantum dot to emit green light.

A scattering substance SP may further be included in each of the plurality of light control parts CCP-R, CCP-B, and CCP-G included in the light control layer CCL. The first light control part CCP-B may include a first quantum dot QD1 and a scattering substance SP, the second light control part CCP-G may include a second quantum dot QD2 and a scattering substance SP, and the third light control part CCP-R may include a third quantum dot QD3 and a scattering substance SP. The present disclosure, however, is not limited thereto, and the first light control part CCP-B may exclude the first quantum dot QD1 and may include only the scattering substance SP.

The scattering substance SP may be an inorganic particle. For example, the scattering substance SP may include at least one selected from $TiO_2$, ZnO, $Al_2O_3$, $SiO_2$, and hollow silica. The scattering substance SP may include one selected from $TiO_2$, ZnO, $Al_2O_3$, $SiO_2$, and hollow silica, or may be a mixture including at least two thereof.

Each of first, second, and third light control parts CCP-B, CCP-G, and CCP-R may include a corresponding one of base resins BR1, BR2, and BR3 in which the scattering substances SP and the respective quantum dots QD1, QD2, and QD3 are dispersed. In one or more embodiments, the first light control part CCP-B may include a first quantum dot QD1 and a scattering substance SP that are dispersed in the first base resin BR1, the second light control part CCP-G may include a second quantum dot QD2 and a scattering substance SP that are dispersed in the second base resin BR2, and the third light control part CCP-R may include a third quantum dot QD3 and a scattering substance SP that are dispersed in the third base resin BR3. The base resins BR1, BR2, and BR3 may be mediums in which the scattering substances SP and the quantum dots QD1, QD2, and QD3 are dispersed, and may be formed of one or more of resin compositions which may be referred to as binders. For example, the base resins BR1, BR2, and BR3 may each independently be an acryl-based resin, a urethane-based resin, a silicone-based resin, and/or an epoxy-based resin. The base resins BR1, BR2, and BR3 may be transparent resins. In one or more embodiments, the first, second, and third base resins BR1, BR2, and BR3 may be the same as or different from each other.

The partition walls BK may define openings that distinguish from each other (e.g., separate) the pixel regions PXA-R, PXA-B, and PXA-G that overlap the light control layer CCL. The light control parts CCP-R, CCP-B, and CCP-G may fill the openings that are defined by the partition walls BK. The partition walls BK may be formed of a light-absorbing material, a black pigment, and/or a black dye.

The light control member CCM according to one or more embodiments may further include the color filter layer CFL. The color filter layer CFL may be disposed between the base layer BL and the light control layer CCL. The color filter layer CFL may include a light shield BM and a plurality of filters CF-B, CF-G, and CF-R. The color filter layer CFL may include a first filter CF-B transparent to (e.g., configured to let through) blue light, a second filter CF-G transparent to (e.g., configured to let through) green light, and a third filter CF-R transparent to (e.g., configured to let through) red light. For example, the first filter CF-B may be a blue color filter, the second filter CF-G may be a green color filter, and the third filter CF-R may be a red color filter. Each of the filters CF-B, CF-G, and CF-R may include a polymeric photosensitive resin and either a pigment or a dye. The first filter CF-B may include a blue pigment or dye, the second filter CF-G may include a green pigment or dye, and the third filter CF-R may include a red pigment or dye. The present disclosure, however, is not limited thereto, and the first filter CF-B may not include a pigment or a dye. The first filter CF-B may include a polymeric photosensitive resin, but not include a pigment or dye. The first filter CF-B may be transparent. The first filter CF-B may be formed of a transparent photosensitive resin.

In one or more embodiments, the second filter CF-G and the third filter CF-R may be a yellow color filter. The second filter CF-G and the third filter CF-R may be provided as a single piece without being distinguished from each other.

The light shield BM may be a black matrix. The light shield BM may be formed of an inorganic or organic light shielding material including a black pigment or dye. The light shield BM may prevent or reduce light leakage and may define a boundary between adjacent ones of the filters CF-B, CF-G, and CF-R. In one or more embodiments, the light shield BM may be formed of a blue color filter. A plurality of light shields BM may correspondingly overlap a plurality of partition walls BK.

The first, second, and third filters CF-B, CF-G, and CF-R may be disposed to correspond to the blue pixel region PXA-B, the green pixel region PXA-G, and the red pixel region PXA-R, respectively.

The upper base layer BL may be disposed on the color filter layer CFL. The upper base layer BL may be a member that provides a base surface on which the color filter layer CFL and the light control layer CCL are disposed. The upper base layer BL may be a glass substrate, a metal substrate, and/or a plastic substrate. The present disclosure, however, is not limited thereto, and the upper base layer BL may be an inorganic layer, an organic layer, or a composite material layer (e.g., including an organic material and an inorganic material). In one or more embodiments, the upper base layer BL may be omitted.

In one or more embodiments, the color filter layer CFL may further include a low-refractive layer. The low-refractive layer may be disposed between the light control layer CCL and the filters CF-B, CF-G, and CF-R. The low-refractive layer may have a refractive index of about 1.1 to about 1.5. The refractive index of the low-refractive layer may be controlled by proportions of hollow inorganic particles and/or voids.

In one or more embodiments, the display module DM may further include an antireflection layer that is disposed on or below the color filter layer CFL and blocks or reduces external light incident on the display module DM. The antireflection layer may partially block or reduce external light. The antireflection layer may reduce reflected light that is generated from external light reflected from the display panel DP. The antireflection layer may be, for example, a polarization layer. In one or more embodiments, the display module DM may include a polarization layer disposed below the upper base layer BL, and the color filter layer CFL may be omitted.

The light control member CCM may further include buffer layers BFL1 and BFL2 that block or reduce moisture and/or oxygen and protect components disposed thereon or thereunder. The buffer layers BFL1 and BFL2 may include a first buffer layer BFL1 and a second buffer layer BFL2. The first buffer layer BFL1 may be disposed between the thin-film encapsulation layer TFE and the light control layer CCL. The second buffer layer BFL2 may be disposed between the light control layer CCL and the color filter layer CFL.

The first buffer layer BFL1 may serve to prevent or reduce the permeation of moisture and/or oxygen (called moisture/oxygen hereinafter) into the light control layer CCL. The first buffer layer BFL1 may be disposed below the light control layer CCL and may prevent or reduce exposure of the light control layer CCL to moisture/oxygen. The first buffer layer BFL1 may include at least one inorganic layer. For example, the first buffer layer BFL1 may be formed of an inorganic material. For example, the first buffer layer BFL1 may be formed either of a material including one or more selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or of a metal film whose light transmittance is secured. The first buffer layer BFL1 may further include an organic layer. The first buffer layer BFL1 may be formed of a single layer or a plurality of layers.

The second buffer layer BFL2 may be a protection layer that protects the light control layer CCL and the color filter layer CFL. The second buffer layer BFL2 may be an inorganic layer including at least one inorganic material, such as silicon nitride, silicon oxide, and/or silicon oxynitride. The second buffer layer BFL2 may be formed of a single layer or a plurality of layers.

Referring to FIG. 4B, the display module DM-1 according to one or more embodiments may include a display panel DP and a light control member CCM-1 disposed on the display panel DP, and the light control member CCM-1 may include a light control layer CCL-1 and a color filter layer CFL-1. For the display module DM-1 according to one or more embodiments, the light control layer CCL-1 may be disposed on the display panel DP. The light control layer CCL-1 may be placed on the display panel DP, with the first buffer layer BFL1 therebetween.

The light control layer CCL-1 of the light control member CCM-1 may include a plurality of partition walls BK and a plurality of light control parts CCP-R, CCP-B, and CCP-G disposed between the partition walls BK. The color filter layer CFL-1 may include a light shield BM-1 and a plurality of filters CF-R1, CF-B1, and CF-G1.

In comparison with the display module DM depicted in FIG. 4A, the display module DM-1 according to one or more embodiments depicted in FIG. 4B may be an example in which the upper base layer BL is omitted, and in which the thin-film encapsulation layer TFE has a top surface that serves as a base surface on which the light control layer CCL-1 and the color filter layer CFL-1 are disposed. For example, the light control parts CCP-R, CCP-B, and CCP-G of the light control layer CCL-1 may be formed on the display panel DP in a successive process, and the filters CF-R1, CF-B1, and CF-G1 may be sequentially formed on the light control layer CCL-1 in a successive process.

In one or more embodiments, the color filter layer CFL-1 may include a low-refractive layer. One or more of the light shield BM-1 and/or the filters CF-R1, CF-B1, and CF-G1 may be omitted from the color filter layer CFL-1. The light control member CCM-1 may further include buffer layers BFL1 and BFL2 that block or reduce moisture/oxygen and protect components disposed thereon or thereunder. The buffer layers BFL1 and BFL2 may include a first buffer layer BFL1 disposed between the thin-film encapsulation layer TFE and the light control layer CCL-1, and may also include a second buffer layer BFL2 disposed between the light control layer CCL-1 and the color filter layer CFL-1.

In comparison with the display module DM depicted in FIG. 4A, the display module DM-2 according to one or more embodiments shown in FIG. 4C may further include a white pixel region PXA-W, in addition to the pixel regions PXA-R, PXA-B, and PXA-G. For the display module DM-2 according to one or more embodiments, the light emitting device ED may generate white light, and the white pixel region PXA-W may transmit the light that is generated without being changed from the light emitting device ED. As shown in FIG. 4C, the pixel regions PXA-R, PXA-B, PXA-G, and PXA-W are illustrated to have the same (or substantially the same) planar area, but the white pixel region PXA-W may have an area different from those of other pixel regions PXA-R, PXA-B, and PXA-G. The white light emitted from the white pixel region PXA-W may be a mixed light of various rays having different wavelengths.

A light control layer CCL-2 of the display module DM-2 according to one or more embodiments may further include a fourth light control part CCP-T, in addition to the first, second, and third light control parts CCP-B, CCP-G, and CCP-R. The fourth light control part CCP-T may be disposed to overlap the white pixel region PXA-W. The partition wall BK may be provided between the fourth light control part CCP-T and its adjacent other light control part. The fourth light control part CCP-T may include no light emitting body such as a quantum dot. The fourth light control part CCP-T may be a transmission part that allows incident light to pass therethrough with no change in wavelength of the incident light. The fourth light control part CCP-T may include only scattering substances SP dispersed in a fourth base resin BR4. The explanation mentioned above may be applicable to the fourth base resin BR4 and the scattering substance SP.

A color filter layer CFL-2 of the display module DM-2 according to one or more embodiments may have an opening that is defined to overlap the white pixel region PXA-W. The light shield BM and the filters CF-B, CF-G, and CF-R included in the color filter layer CFL-2 may not overlap the white pixel region PXA-W. For example, the first filter CF-B may have an opening that is defined to correspond to the white pixel region PXA-W, and thus neither the filters CF-B, CF-G, and CF-R nor the light shield BM may overlap the white pixel region PXA-W. The present disclosure, however, is not limited thereto, and the first filter CF-B may overlap the white pixel region PXA-W and may be formed of a transparent photosensitive resin.

FIGS. 5A to 5D illustrate simplified cross-sectional views showing a light emitting device according to one or more embodiments of the present disclosure. With reference to FIGS. 5A to 5D, the following will describe in more detail light emitting devices ED, ED-1, ED-2, and ED-3 according to one or more embodiments of the present disclosure.

Figure 5A:
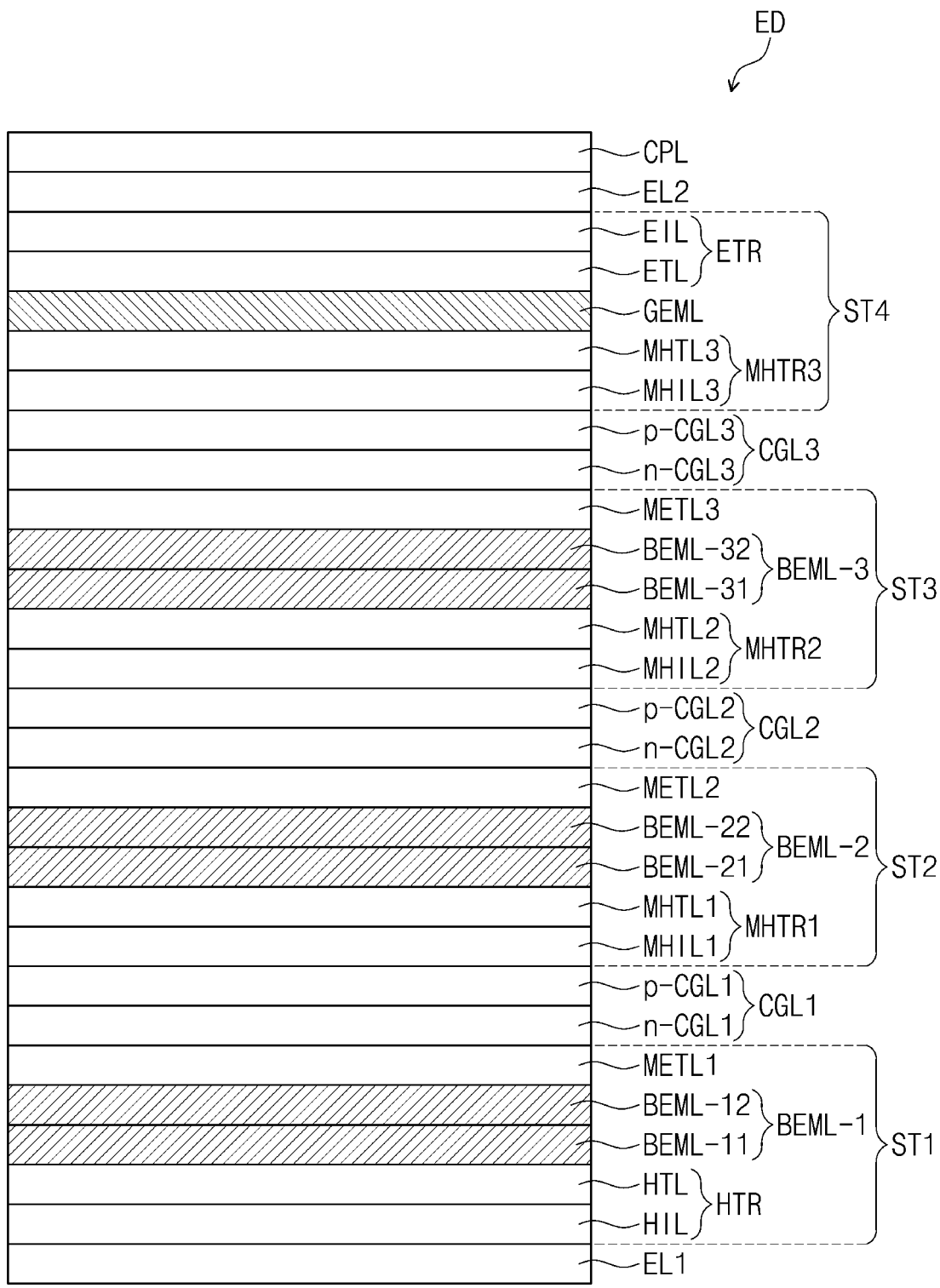
FIGS. 5A-5D illustrate simplified cross-sectional views showing a light emitting device according to one or more embodiments of the present disclosure.

Referring to FIG. 5A, the light emitting device ED according to one or more embodiments may include a first electrode EL1, a second electrode EL2 that faces the first electrode EL1, and a plurality of stacks ST1, ST2, ST3, and ST4 disposed between the first electrode EL1 and the second electrode EL2. The plurality of stacks ST1, ST2, ST3, and ST4 may include a first stack ST1, a second stack ST2, a third stack ST3, and a fourth stack ST4. Each of the first, second, third, and fourth stacks ST1, ST2, ST3, and ST4 may include an emission layer. FIG. 5A depicts by way of example that the light emitting device ED includes total four stacks ST1, ST2, ST3, and ST4, but the present disclosure is not limited thereto, and the light emitting device ED may include two stacks, three stacks, or five or more stacks. For example, the light emitting device ED depicted in FIG. 5A may have a structure from which the second and third stacks ST2 and ST3 are omitted and which has two stacks, the first and fourth stacks ST1 and ST4.

The light emitting device ED according to one or more embodiments may include a hole transport region HTR disposed between the first electrode EL1 and the plurality of stacks ST1, ST2, ST3, and ST4. An electron transport region ETR may be disposed between the second electrode EL2 and the plurality of stacks ST1, ST2, ST3, and ST4. In one or more embodiments, the light emitting device ED may emit light along a direction from the first electrode EU toward the second electrode EL2. When viewed in the light emission direction, the light emitting device ED according to one or more embodiments is exemplarily illustrated to have a structure in which the hole transport region HTR is disposed below the plurality of stacks ST1, ST2, ST3, and ST4, and in which the electron transport region ETR is disposed on the plurality of stacks ST1, ST2, ST3, and ST4. The present disclosure, however, is not limited thereto, and when viewed in the light emission direction, the light emitting device ED may have an inverted device structure in which the electron transport region ETR is disposed below the plurality of stacks ST1, ST2, ST3, and ST4, and in which the hole transport region HTR is disposed on the plurality of stacks ST1, ST2, ST3, and ST4.

The light emitting device ED according to one or more embodiments may include charge generation layers CGL1, CGL2, and CGL3 disposed between the plurality of stacks ST1, ST2, ST3, and ST4. The light emitting device ED according to one or more embodiments may include a first charge generation layer CGL1 disposed between the first stack ST1 and the second stack ST2, a second charge generation layer CGL2 disposed between the second stack ST2 and the third stack ST3, and a third charge generation layer CGL3 disposed between the third stack ST3 and the fourth stack ST4.

When a voltage is applied, the charge generation layers CGL1, CGL2, and CGL3 may generate charges (electrons and holes) by forming complexes through oxidation-reduction reactions. Then, the charge generation layers CGL1, CGL2, and CGL3 may provide the generated charges to their neighboring stacks ST1, ST2, ST3, and ST4. The charge generation layers CGL1, CGL2, and CGL3 may double efficiency of currents generated from the stacks ST1, ST2, ST3, and ST4, and may serve to control balance of charges between neighboring stacks ST1, ST2, ST3, and ST4.

Each of the charge generation layers CGL1, CGL2, and CGL3 may have a layered structure in which a corresponding one of n-type charge generation layers n-CGL1, n-CGL2, and n-CGL3 is combined with a corresponding one of p-type charge generation layers p-CGL1, p-CGL2, and p-CGL3. The first charge generation layer CGL1 may have a layered structure in which a first n-type charge generation layer n-CGL1 is combined with a first p-type charge generation layer p-CGL1. The second charge generation layer CGL2 may have a layered structure in which a second n-type charge generation layer n-CGL2 is combined with a second p-type charge generation layer p-CGL2. The third charge generation layer CGL3 may have a layered structure in which a third n-type charge generation layer n-CGL3 is combined with a third p-type charge generation layer p-CGL3.

The n-type charge generation layers n-CGL1, n-CGL2, and n-CGL3 may be charge generation layers that provide electrons for stacks adjacent thereto. Each of the n-type charge generation layers n-CGL1, n-CGL2, and n-CGL3 may be a layer in which n-type dopants are doped into a base material. The p-type charge generation layers p-CGL1, p-CGL2, and p-CGL3 may be charge generation layers that provide holes for stacks adjacent thereto. In one or more embodiments, buffer layers may further be disposed between the n-type charge generation layers n-CGL1, n-CGL2, and n-CGL3 and the p-type charge generation layers p-CGL1, p-CGL2, and p-CGL3.

Each of the charge generation layers CGL1, CGL2, and CGL3 may include an n-type arylamine-based material and/or p-type metal oxide. For example, each of the charge generation layers CGL1, CGL2, and CGL3 may include a charge generation compound formed of an arylamine-based organic compound, metal, metal oxide, metal carbide, metal fluoride of metal, or any mixture thereof.

For example, the arylamine-based organic compound may include NPD, 2-TNATA, TDATA, MTDATA, spiro-TAD, and/or spiro-NPB. The metal may include cesium (Cs), molybdenum (Mo), vanadium (V), titanium (Ti), tungsten (W), barium (Ba), and/or lithium (Li). The metal oxide, metal carbide, and metal fluoride may include $Re_2O_7$, $MoO_3$, $V_2O_5$, $WO_3$, $TiO_2$, $Cs_2CO_3$, BaF, LiF, and/or CsF.

For the light emitting device ED according to one or more embodiments, each of the first, second, and third stacks ST1, ST2, and ST3 may respectively include a corresponding one of first emission layers BEML-1, BEML-2, and BEML-3, each of which emits light having a first wavelength. The light having a first wavelength may be light having a red color wavelength range. In one or more embodiments, the first wavelength may be in a range from about 420 nm to about 480 nm.

One or more of the first emission layers BEML-1, BEML-2, and BEML-3 may have a bilayered structure. The bilayered structure of one or more of the first emission layers BEML-1, BEML-2, and BEML-3 may include different host materials from each other. For example, as shown in FIG. 5A, the first emission layers BEML-1, BEML-2, and BEML-3 may all have the bilayered structure.

In one or more embodiments, one layer included in the bilayered structure may include a hole transport host material, and the other layer included in the bilayered structure may include an electron transport host material. The hole transport host material may include a material in which a hole transport moiety is included a molecular structure. The electron transport host material may include a material in which an electron transport moiety is included a molecular structure. No layer may be disposed between the layers of the bilayered structures included in the first emission layers BEML-1, BEML-2, and BEML-3, and the layers of each bilayered structure may be in contact with each other.

In one or more embodiments, among the first emission layers BEML-1, BEML-2, and BEML-3, the first-1 emission layer BEML-1 included in the first stack ST1 may have the bilayered structure. The first-1 emission layer BEML-1 may include a first sub-emission layer BEML-11 and a second sub-emission layer BEML-12. The first and second sub-emission layers BEML-11 and BEML-12 may be in contact with each other. The first sub-emission layer BEML-11 may include a first hole transport host material and a first sub-dopant to emit the light having a first wavelength, and the second sub-emission layer BEML-12 may include a first electron transport host material and a second sub-dopant to emit the light having a first wavelength. In one or more embodiments, the first and second sub-dopants may be the same as each other. The present disclosure, however, is not limited thereto, and the first and second sub-dopants may be different from each other. Each of the first and second sub-dopants may be a blue fluorescent dopant.

Like the first-1 emission layer BEML-1, the first-2 emission layer BEML-2 included in the second stack ST2 may also have the bilayered structure. The first-2 emission layer BEML-2 may include a third sub-emission layer BEML-21 and a fourth sub-emission layer BEML-22. The third and fourth sub-emission layers BEML-21 and BEML-22 may be in contact with each other. The third sub-emission layer BEML-21 may include a second hole transport host material and a third sub-dopant to emit the light having a first wavelength, and the fourth sub-emission layer BEML-22 may include a second electron transport host material and a fourth sub-dopant to emit the light having a first wavelength. In one or more embodiments, the third and fourth sub-dopants may be the same as or different from each other. The third and fourth sub-dopants may be the same as the first and second sub-dopants, respectively. Each of the third and fourth sub-dopants may be a blue fluorescent dopant. The second hole transport host material may be the same as the first hole transport host material. The second electron transport host material may be the same as the first electron transport host material.

Like the first-1 emission layer BEML-1 and the first-2 emission layer BEML-2, the first-3 emission layer BEML-3 included in the third stack ST3 may also have the bilayered structure. The first-3 emission layer BEML-3 may include a fifth sub-emission layer BEML-31 and a sixth sub-emission layer BEML-32. The fifth and sixth sub-emission layers BEML-31 and BEML-32 may be in contact with each other. The fifth sub-emission layer BEML-31 may include a third hole transport host material and a fifth sub-dopant to emit the light having a first wavelength, and the sixth sub-emission layer BEML-32 may include a third electron transport host material and a sixth sub-dopant to emit the light having a first wavelength. In one or more embodiments, the fifth and sixth sub-dopants may be the same as or different from each other. The fifth and sixth sub-dopants may be the same as the first and second sub-dopants, respectively. Each of the fifth and sixth sub-dopants may be a blue fluorescent dopant. The third hole transport host material may be the same as the first hole transport host material. The third electron transport host material may be the same as the first electron transport host material.

A range of about 10 nm to about 30 nm may be given as a thickness of each of the first emission layers BEML-1, BEML-2, and BEML-3 that have their bilayered structure. For the first emission layers BEML-1, BEML-2, and BEML-3, a range of about 5 nm to about 25 nm may be given as a thickness of each of the first, third, and fifth sub-emission layers BEML-11, BEML-21, and BEML-31 each of which includes a hole transport host. For the first emission layers BEML-1, BEML-2, and BEML-3, a range of about 5 nm to about 25 nm may be given as a thickness of each of the second, fourth, and sixth sub-emission layers BEML-12, BEML-22, and BEML-32 each of which includes an electron transport host.

For the first emission layers BEML-1, BEML-2, and BEML-3 having their bilayered structure, a layer including the hole transport host material may have a different thickness from that of a layer including the electron transport host material. In one or more embodiments, the first and second sub-emission layers BEML-11 and BEML-12 may have different thicknesses from each other. The third and fourth sub-emission layers BEML-13 and BEML-14 may have different thicknesses from each other. The fifth and sixth sub-emission layers BEML-15 and BEML-16 may have different thicknesses from each other.

For the first emission layers BEML-1, BEML-2, and BEML-3, a layer including the hole transport host material may have a thickness less than that of a layer including the electron transport host material. In one or more embodiments, the first sub-emission layer BEML-11 may have thickness less than that of the second sub-emission layer BEML-12. The third sub-emission layer BEML-13 may have a thickness less than that of the fourth sub-emission layer BEML-14. The fifth sub-emission layer BEML-15 may have a thickness less than that of the sixth sub-emission layer BEML-16. As the first emission layers BEML-1, BEML-2, and BEML-3 are configured such that a layer including the hole transport host material has a thickness less than that of a layer including the electron transport host material, there may be a reduction in emission ratio of a layer including the hole transport host material relatively susceptible to electrons and an increase in emission ratio of a layer including the electron transport host material formed to be relatively thick. Therefore, it may be possible to prevent or reduce degradation of the hole transport host materials included in the first emission layers BEML-1, BEML-2, and BEML-3, and as a result to increase a lifespan of the light emitting device ED including the first emission layers BEML-1, BEML-2, and BEML-3. The present disclosure, however, is not limited thereto, and for the first emission layers BEML-1, BEML-2, and BEML-3 having their bilayered structure, a layer including the hole transport host material may have substantially the same thickness as that of a layer including the electron transport host material. For the first emission layers BEML-1, BEML-2, and BEML-3, a layer including the hole transport host material and a layer including the electron transport host material may be formed in a successive process, and for convenience of process, may be formed to have substantially the same thickness. In this description, the phrase "thicknesses are substantially the same" may include not only a case in which thicknesses of layers are completely the same, but also a case in which thicknesses of layers are the same within an allowable error range.

For the light emitting device ED according to one or more embodiments, a first hole transport host included in the first emission layers BEML-1, BEML-2, and BEML-3 may include one selected from the following compounds H1-1 to H1-7. In one or more embodiments, one selected from the following compounds H1-1 to H1-7 may be included in each of the first hole transport host material of the first sub-emission layer BEML-11, the second hole transport host material of the third sub-emission layer BEML-21, and the third hole transport host material of the fifth sub-emission layer BEML-31. The first hole transport host included in the first emission layers BEML-1, BEML-2, and BEML-3 is not limited to the following examples.

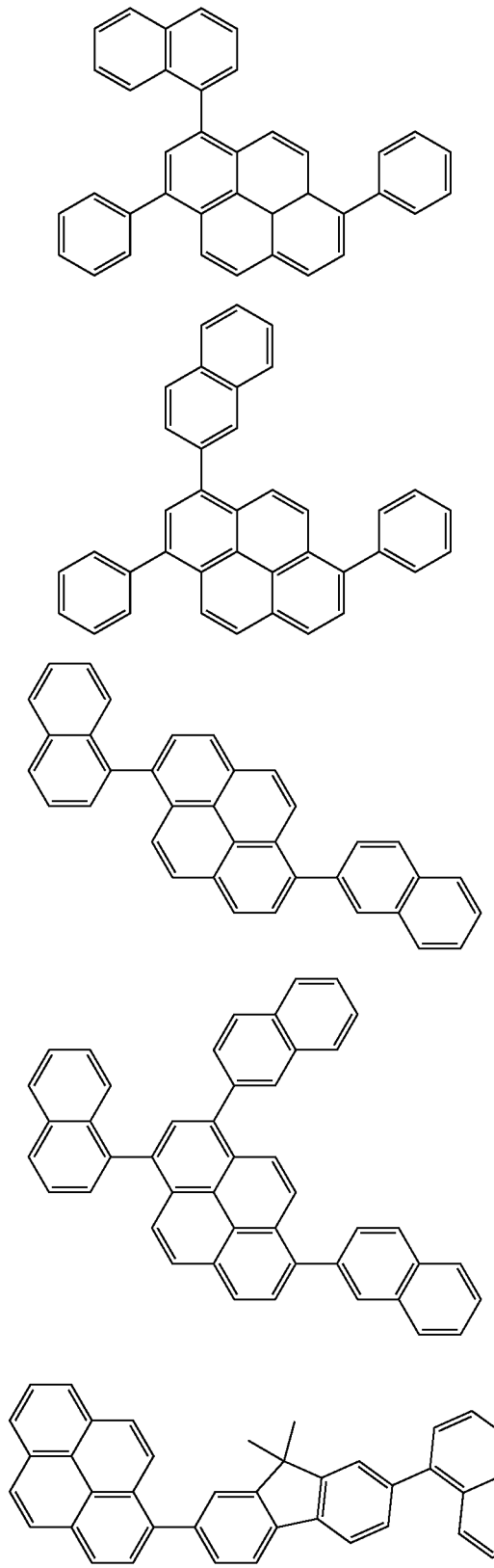

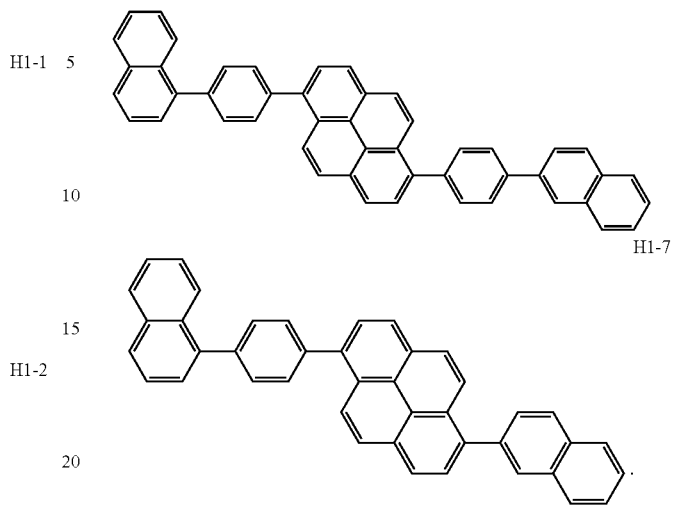

For the light emitting device ED according to one or more embodiments, a first electron transport host included in the first emission layers BEML-1, BEML-2, and BEML-3 may include one selected from the following compounds H2-1 to H2-7. In one or more embodiments, one selected from the following compounds H2-1 to H2-7 may be included in each of the first electron transport host material of the second sub-emission layer BEML-12, the second electron transport host material of the fourth sub-emission layer BEML-22, and the third electron transport host material of the sixth sub-emission layer BEML-32. The first electron transport host included in the first emission layers BEML-1, BEML-2, and BEML-3 is not limited to the following examples.

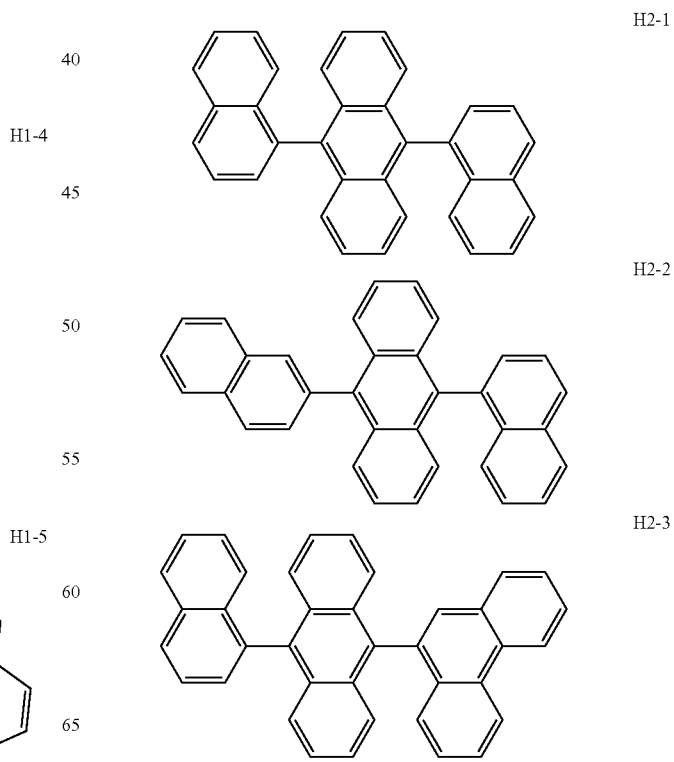

H2-4
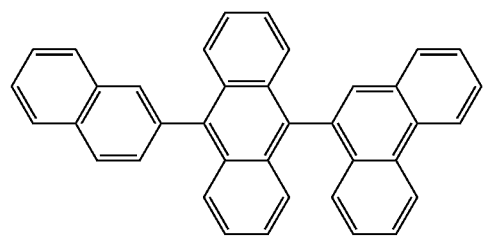

H2-5
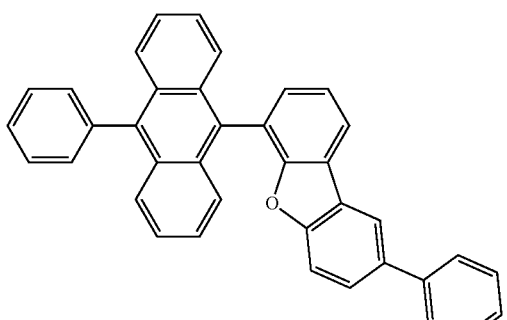

H2-6
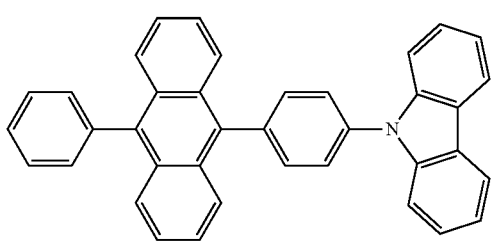

H2-7
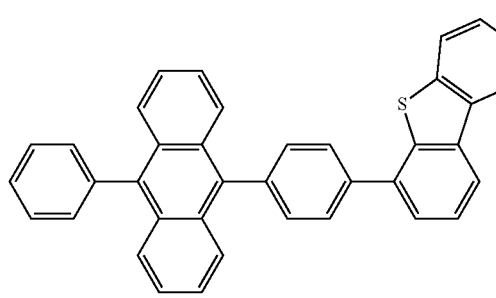

FD1
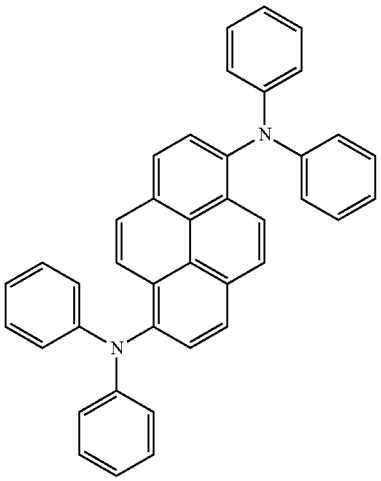

FD2
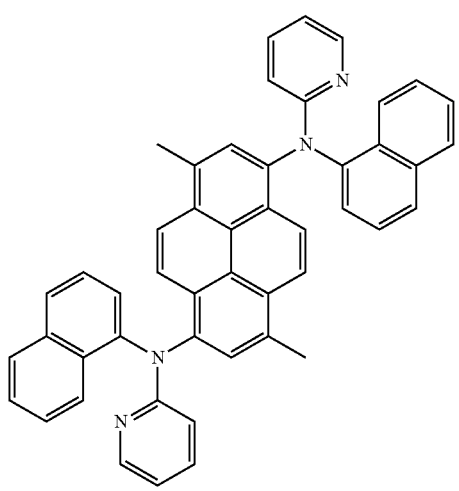

FD3
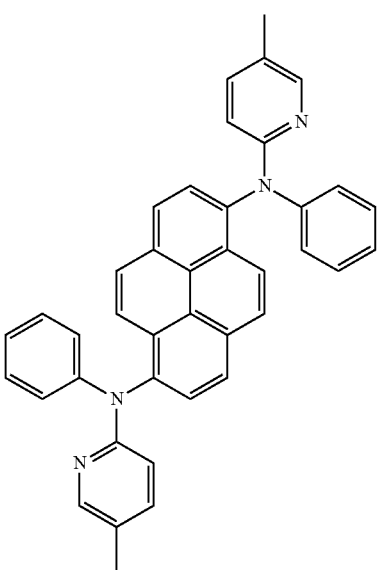

For the light emitting device ED according to one or more embodiments, a first dopant included in the first emission layers BEML-1, BEML-2, and BEML-3 may include one selected from the following compounds FD1 to FD31. In one or more embodiments, one selected from the following compounds FD1 to FD31 may be included in each of the first sub-dopant of the first sub-emission layer BEML-11, the second sub-dopant of the second sub-emission layer BEML-12, the third sub-dopant of the third sub-emission layer BEML-21, the fourth sub-dopant of the fourth sub-emission layer BEML-22, the fifth sub-dopant of the fifth sub-emission layer BEML-31, and the sixth sub-dopant of the sixth sub-emission layer BEML-32. The first dopant included in the first emission layers BEML-1, BEML-2, and BEML-3 is not limited to the following examples.

FD4
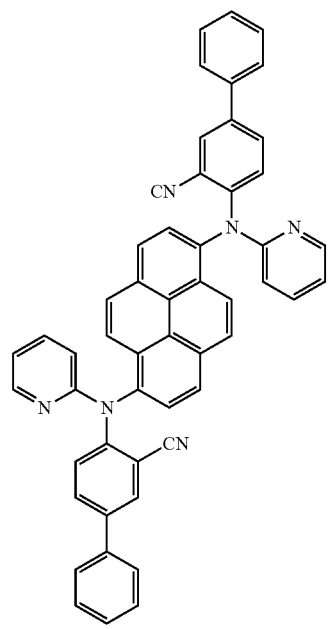
FD5
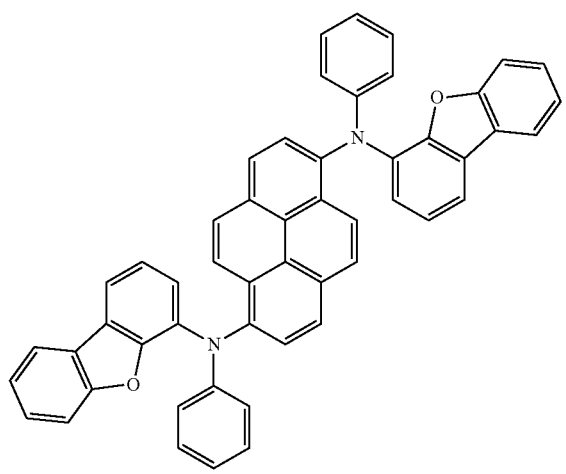
FD6
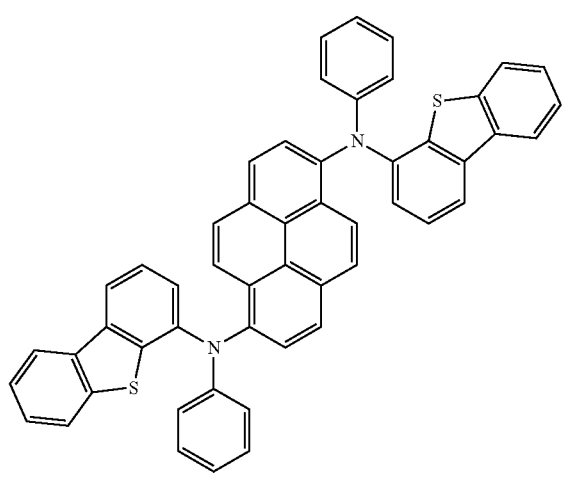
FD7
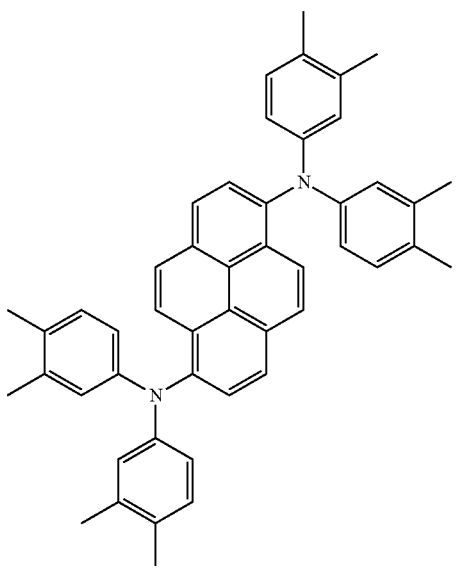
FD8
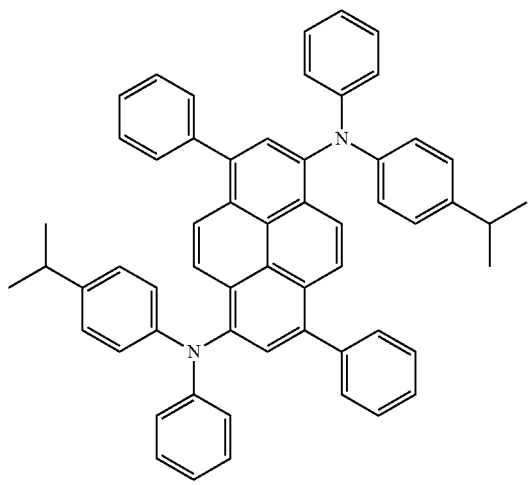
FD9
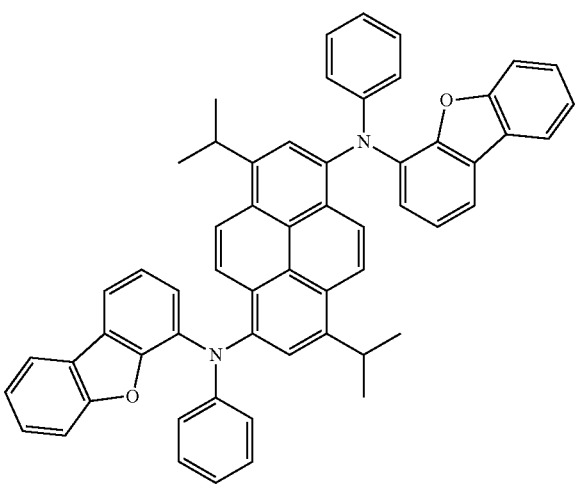

FD10
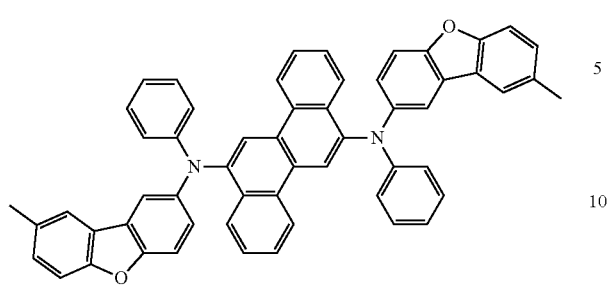
FD11
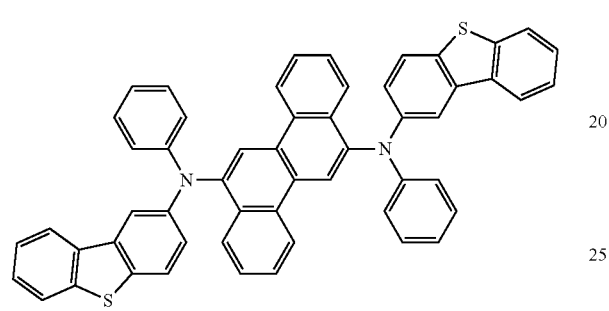
FD12
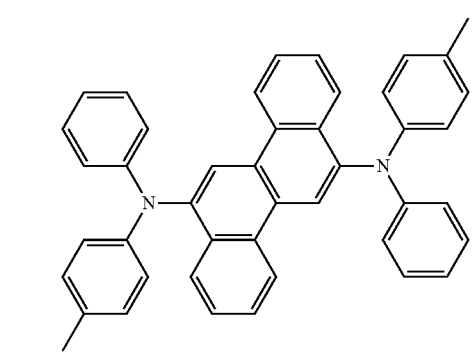
FD13
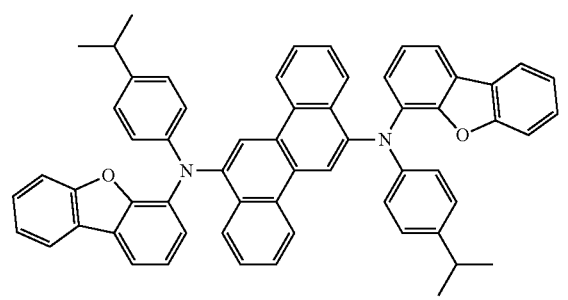
FD14
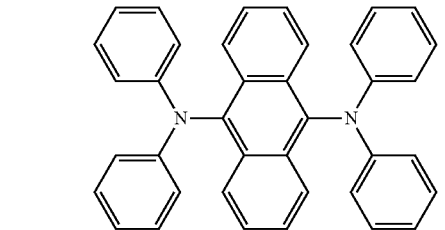
FD15
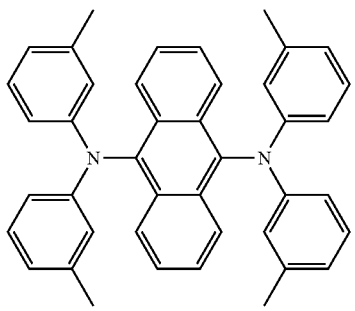
FD16
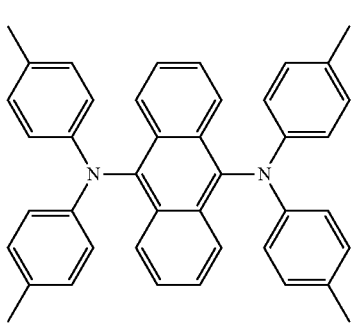
FD17
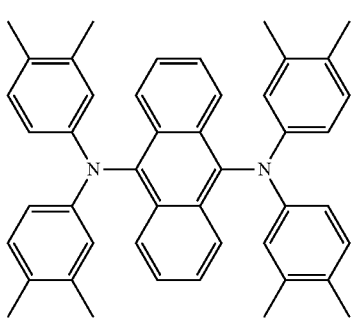
FD18
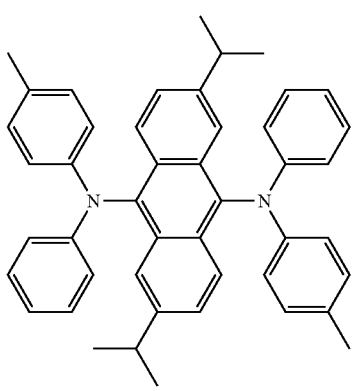

FD19
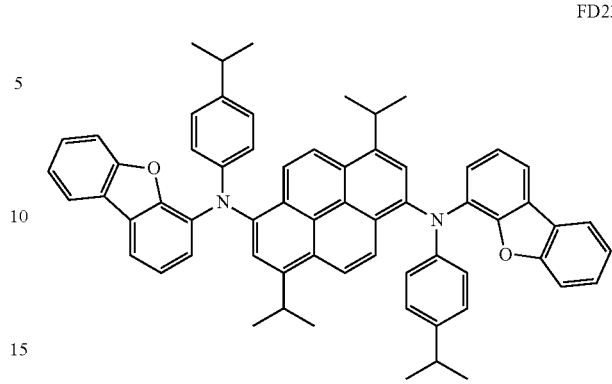
FD20
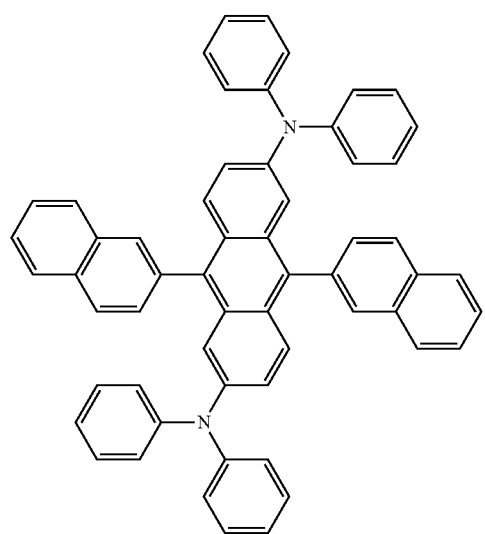
FD23
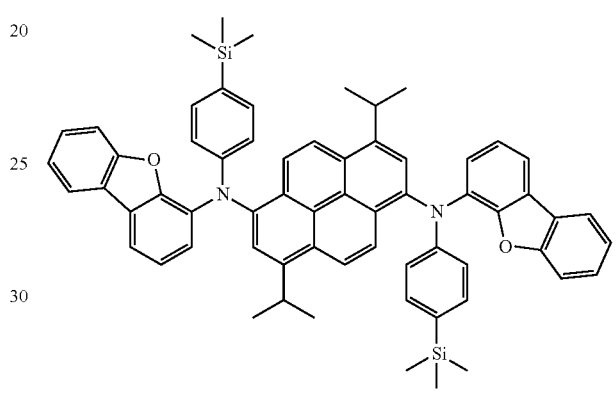
FD21
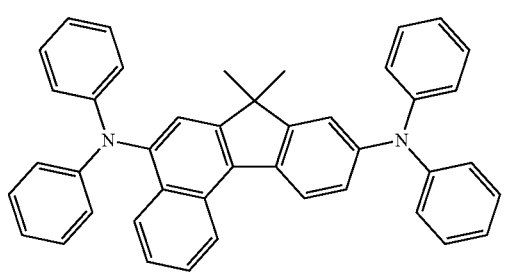
FD24
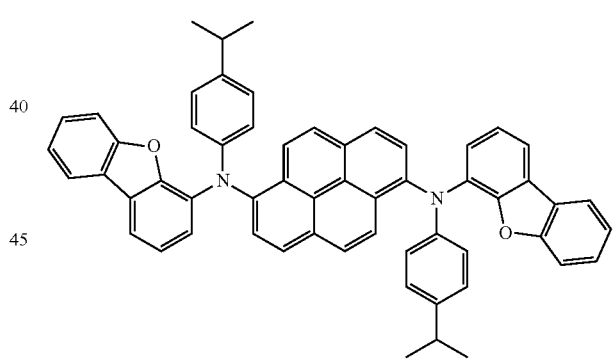
FD22
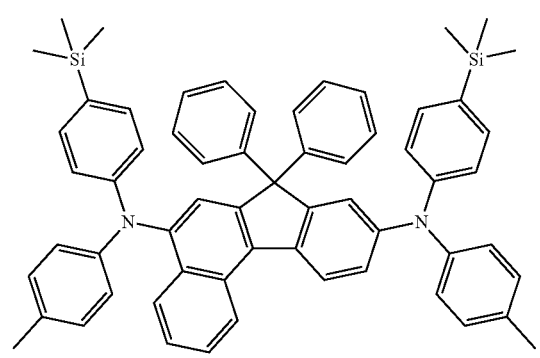
FD25
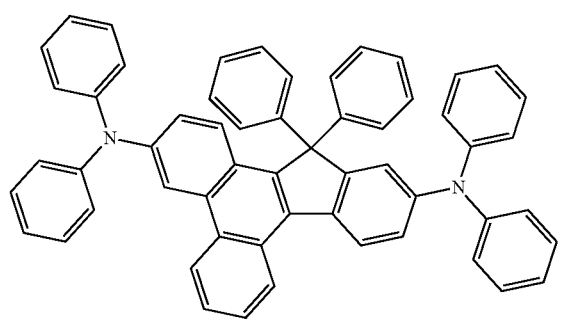
FD26
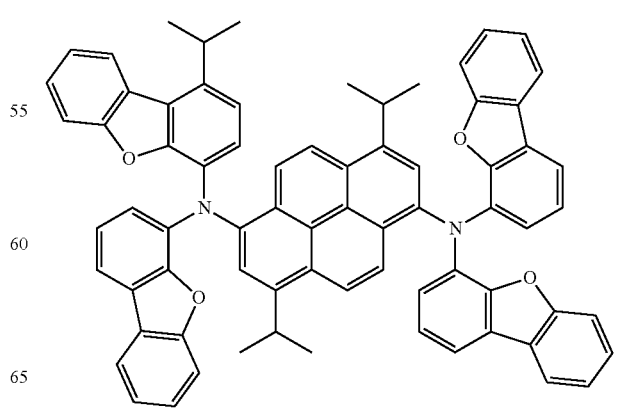

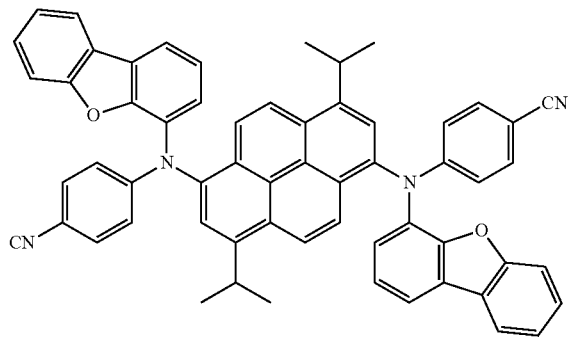

FD27

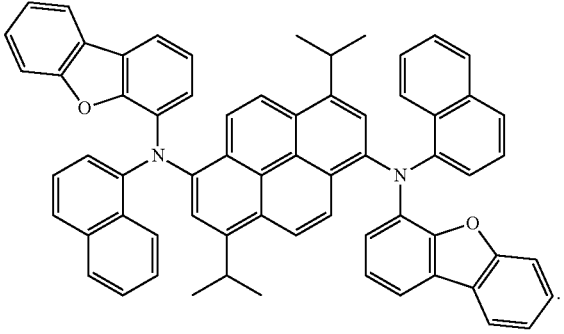

FD31

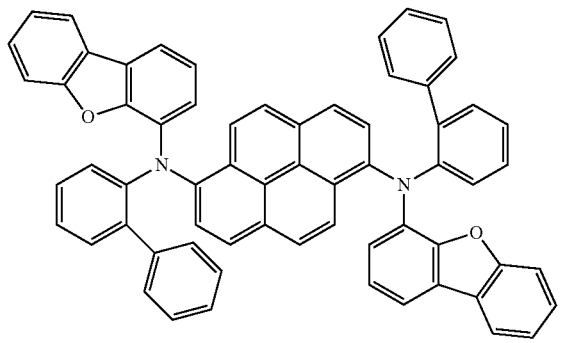

FD28

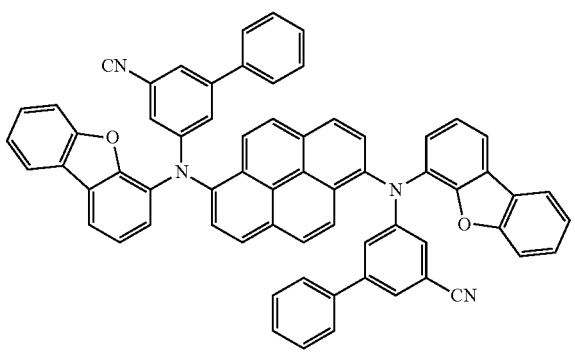

FD29

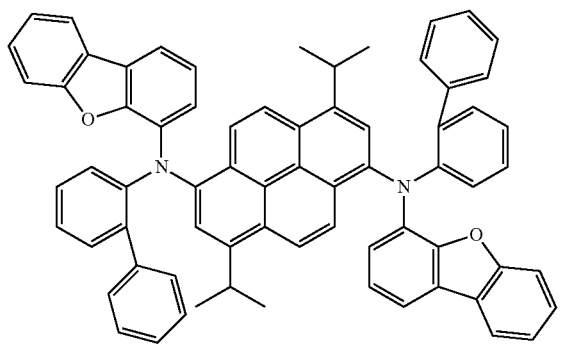

FD30

For the light emitting device ED according to one or more embodiments, the fourth stack ST4 may include a second emission layer GEML to emit light having a second wavelength. The light having the second wavelength may be light having a green color wavelength range. In one or more embodiments, the second wavelength may be in a range from about 520 nm to about 600 nm.

The second emission layer GEML may have a monolayered structure. Different from the first emission layers BEML-1, BEML-2, and BEML-3, the second emission layer GEML may have no bilayered structure. The second emission layer GEML may have a structure in which two different host materials are mixed in a single layer. In one or more embodiments, the second emission layer GEML may have a structure in which a hole transport host material and an electron transport host material are mixed in a single layer.

In one or more embodiments, the second emission layer GEML may have a monolayered structure. The second emission layer GEML may have a second hole transport host, a second electron transport host, and a second dopant. The second emission layer GEML may be configured such that the second dopant to emit the light having a second wavelength is doped in a layer in which the second hole transport host is mixed with the second electron transport host. In one or more embodiments, the second hole transport host included in the second emission layer GEML may be a different material from that of the first hole transport host included in the first sub-emission layer BEML-11. The second electron transport host included in the second emission layer GEML may be a different material from that of the first electron transport host included in the second sub-emission layer BEML-12. The second dopant may be a phosphorescent dopant. The second dopant may be a green phosphorescent dopant.

The monolayered second emission layer GEML may have a thickness of about 10 nm to about 40 nm.

For the light emitting device ED according to one or more embodiments, the second hole transport host included in the second emission layers GEML may include one selected from the following compounds H4-1 to H4-11. However, the second hole transport host included in the second emission layer GEML is not limited to the following examples.

H4-1
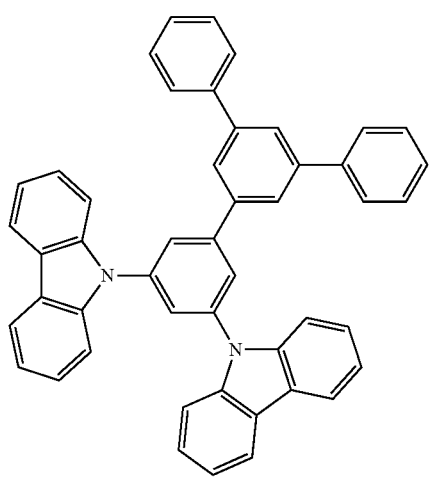
H4-2
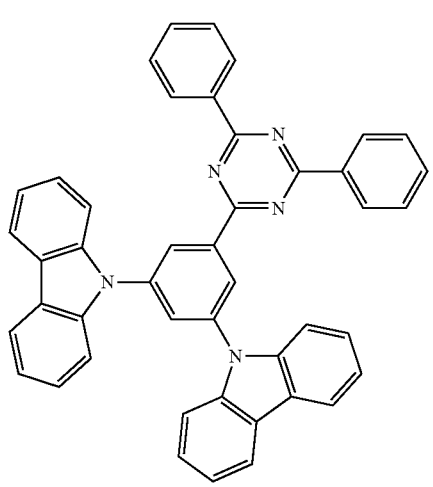
H4-3
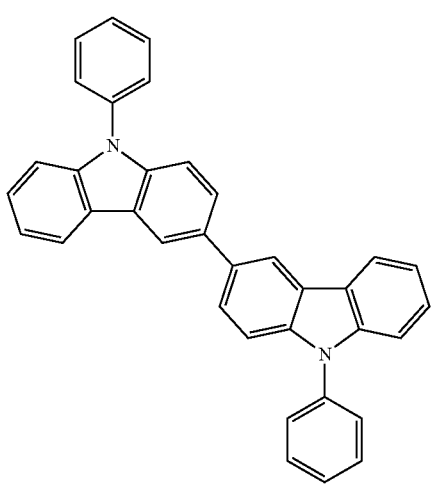
H4-4
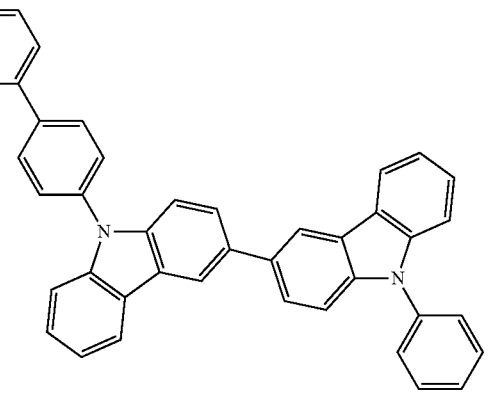
H4-5
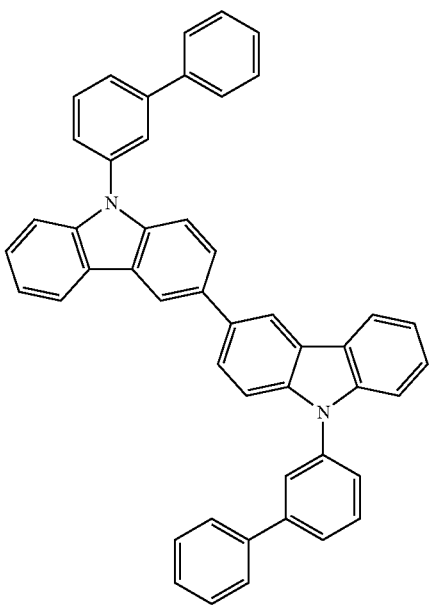
H4-6
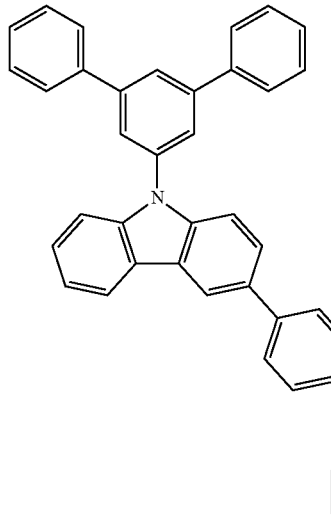

H4-7
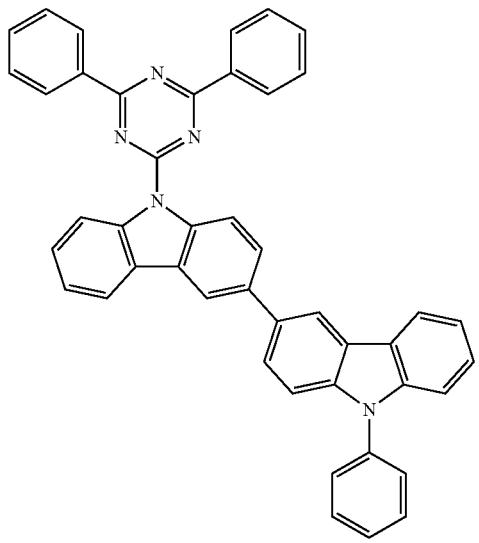
H4-8
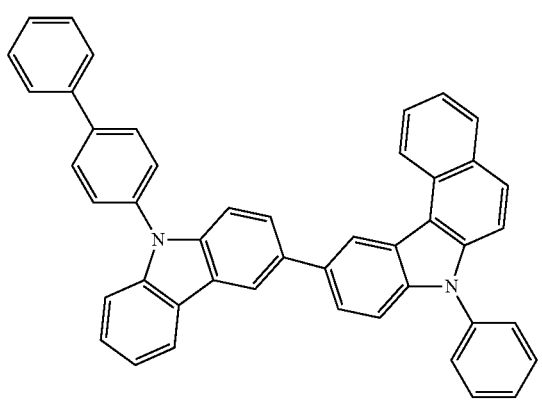
H4-9
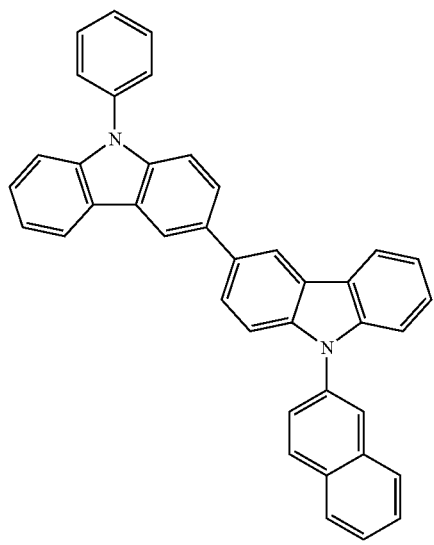
H4-10
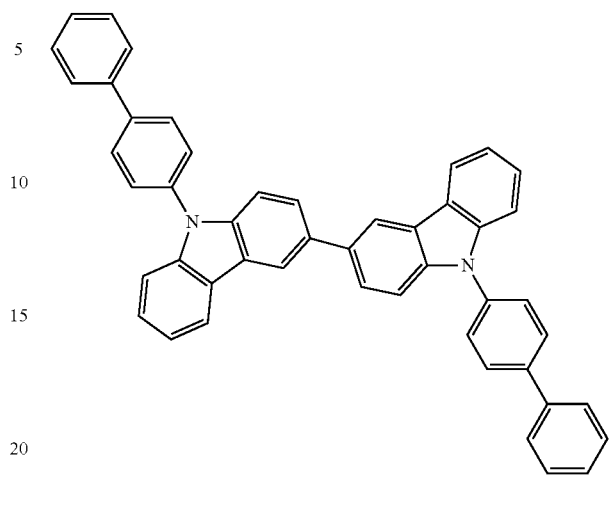
H4-11
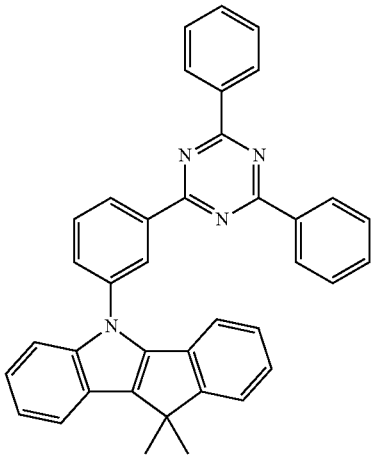
For the light emitting device ED according to one or more embodiments, the second electron transport host included in the second emission layers GEML may include one selected from the following compounds H3-1 to H3-22. However, the second electron transport host included in the second emission layer GEML is not limited to the following examples.
H3-1

H3-2
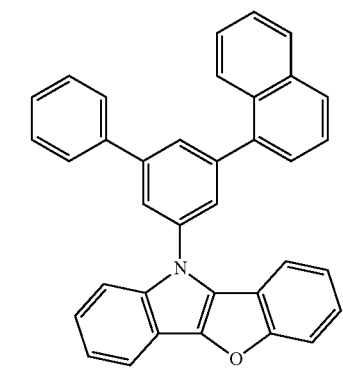
H3-3
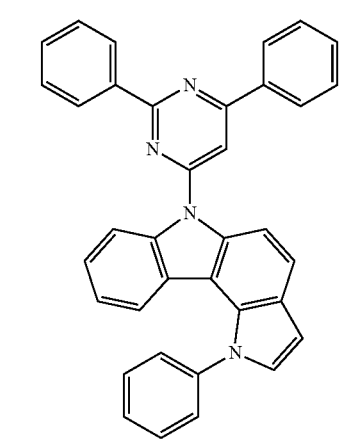
H3-4
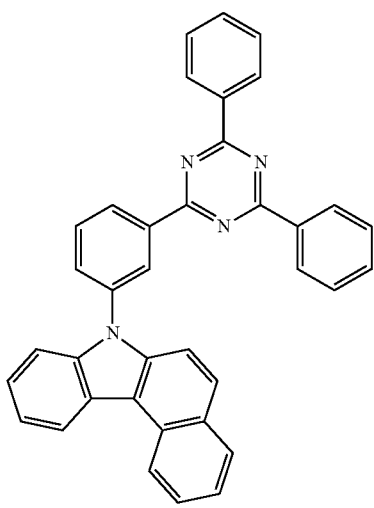
H3-5
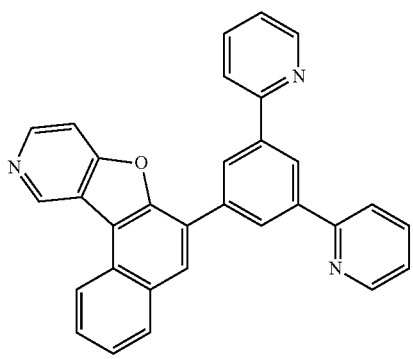
H3-6
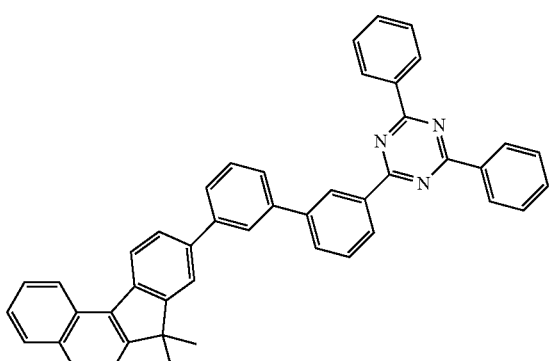
H3-7
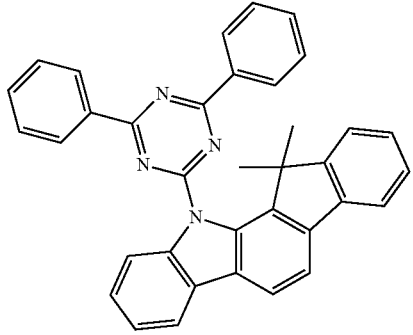
H3-8
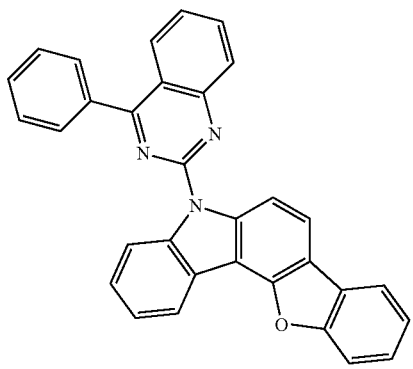

H3-9
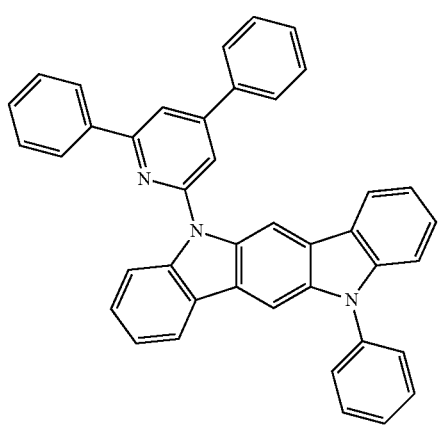
H3-10
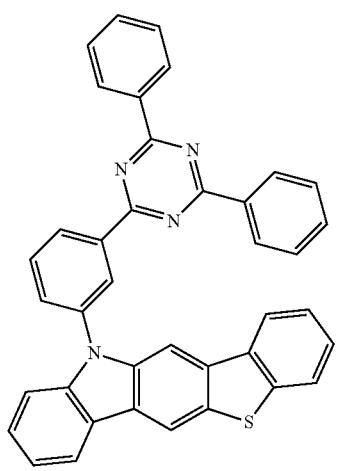
H3-11
H3-12
H3-13
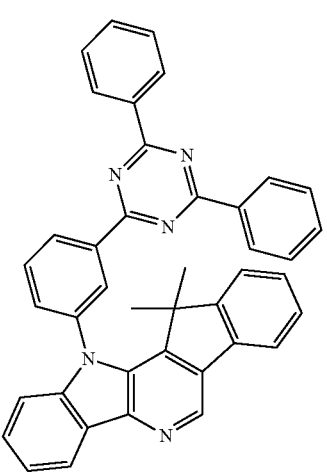
H3-14
H3-15
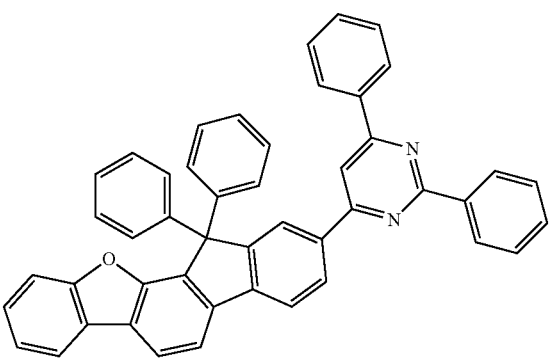
H3-16
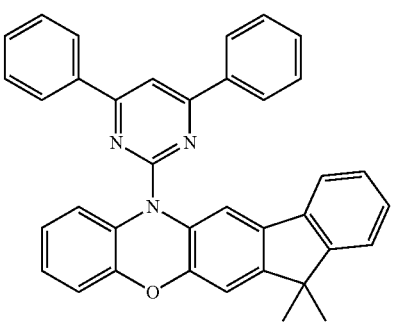

H3-17
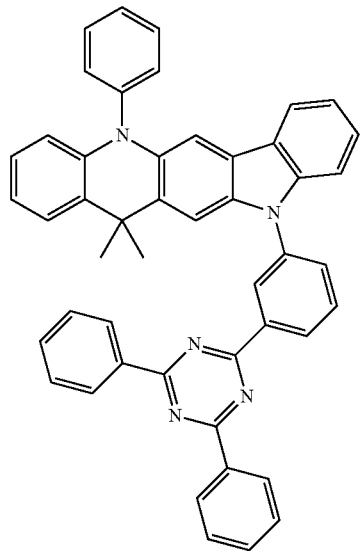
H3-18
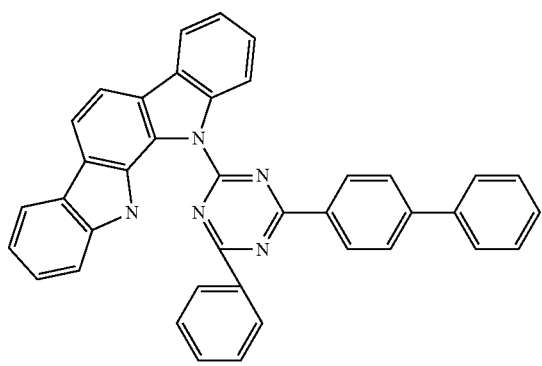
H3-19
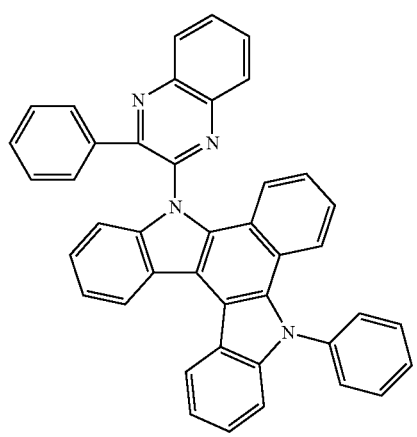
H3-20
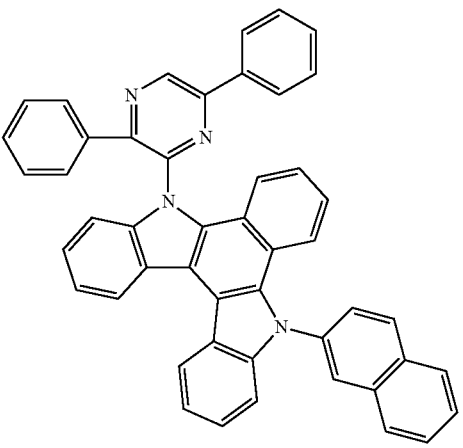
H3-21
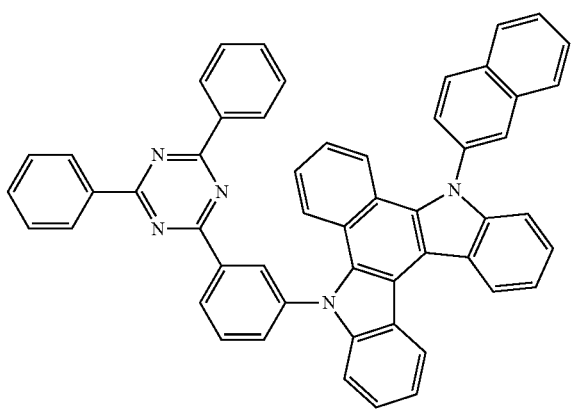
H3-22
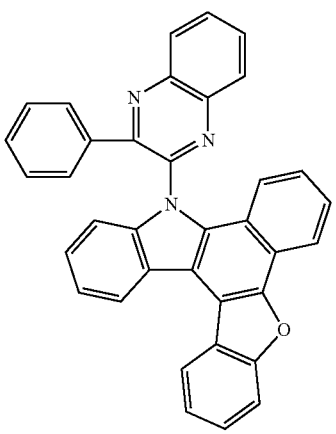
In the light emitting device ED according to one or more embodiments, the second dopant included in the second emission layer GEML may include one selected from the following compounds PD1 to PD25. However, the second dopant included in the second emission layer GEML is not limited to the following examples.

PD1 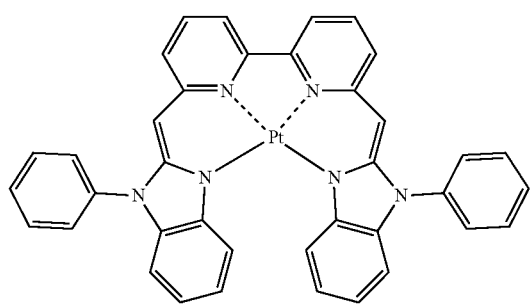
PD2 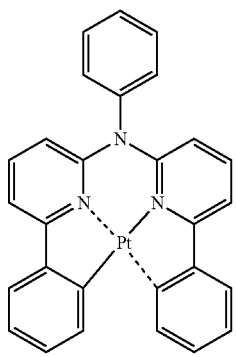
PD3 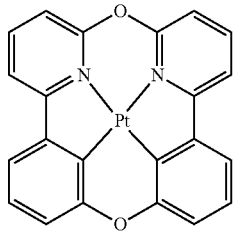
PD4 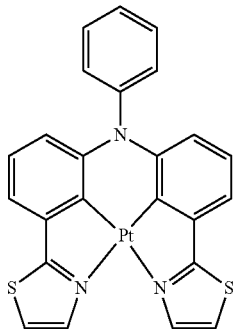
PD5 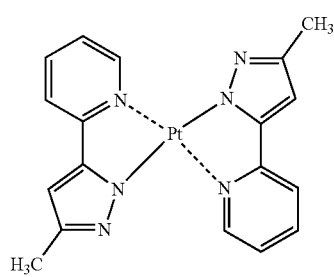
PD6 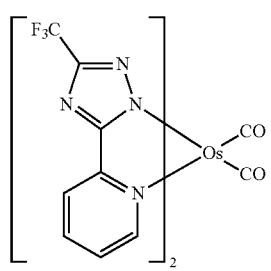
PD7 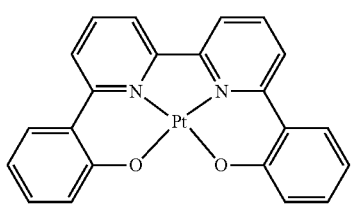
PD8 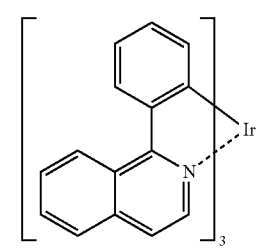
PD9 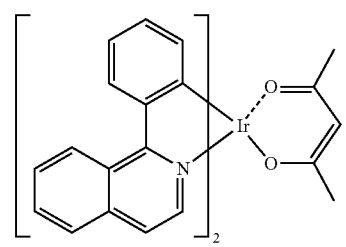
PD10 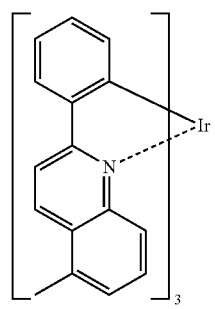
PD11 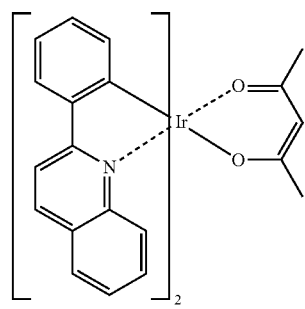

PD12 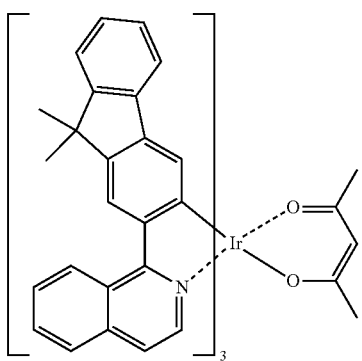
PD13 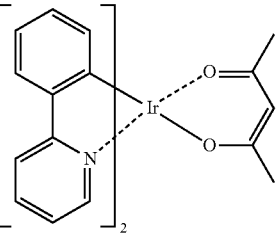
PD14 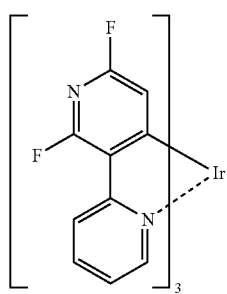
PD15 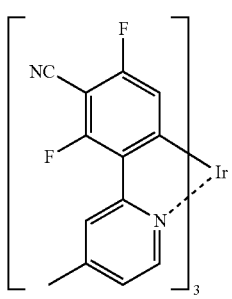
PD16
PD17 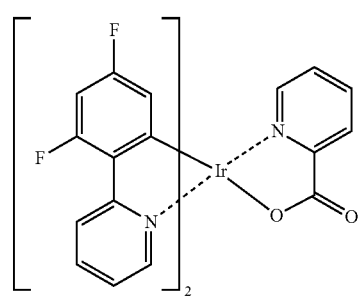
PD18 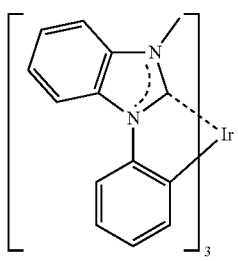
PD19 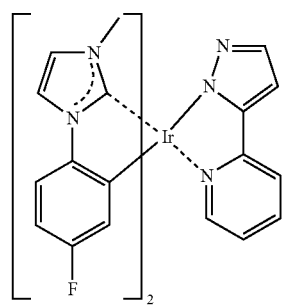
PD20 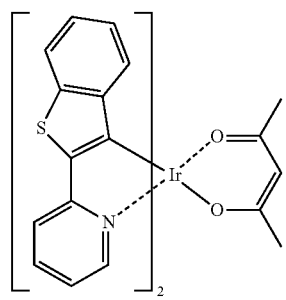
PD21

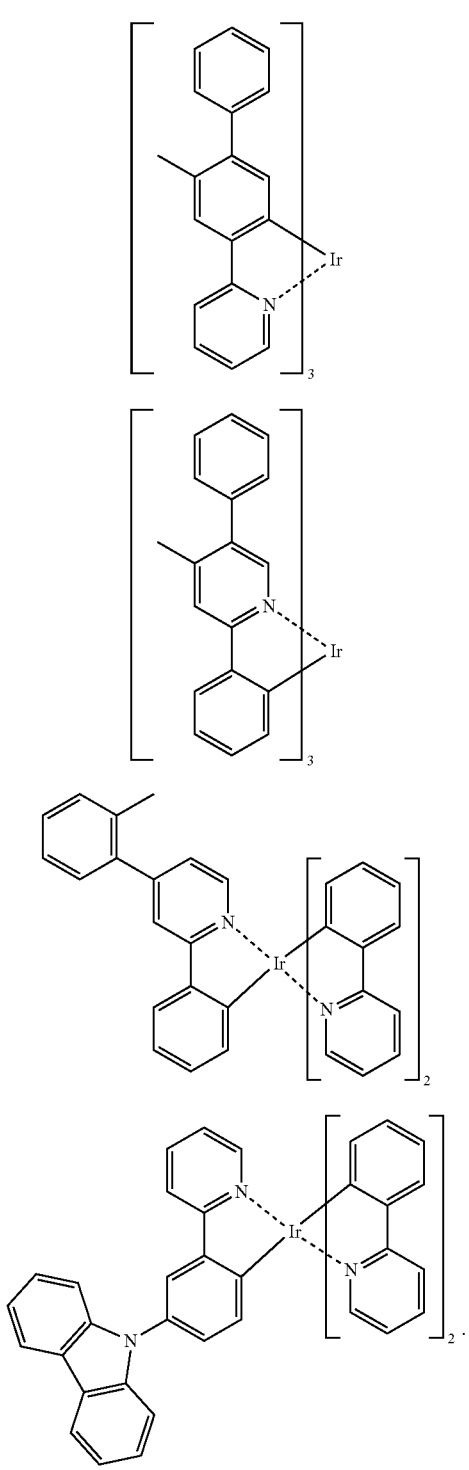

The first stack ST1 may further include a hole transport region HTR that transports holes provided from the first electrode EL1 to the first-1 emission layer BEML-1 and a first middle electron transport region that transports electrons generated from the first charge generation layer CGL1 to the first-1 emission layer BEML-1.

The hole transport region HTR may include a hole injection layer HIL disposed on the first electrode EL1 and a hole transport layer HTL disposed on the hole injection layer HIL. The hole transport layer HTL may be in contact with a bottom surface of the first-1 emission layer BEML-1. The present disclosure, however, is not limited thereto, and the hole transport region HTR may further include a hole-side additional layer disposed on the hole transport layer HTL. The hole-side additional layer may include one or more selected from a hole buffer layer, an emission auxiliary layer, and an electron blocking layer. The hole buffer layer may increase luminous efficiency by compensating a resonance distance due to a wavelength of light emitted from an emission layer. The electron blocking layer may prevent or reduce injection of electrons from an electron transport region to a hole transport region.

The first middle electron transport region may include a first middle electron transport layer METL1 disposed on the first-1 emission layer BEML-1. The first middle electron transport layer METL1 may be disposed between and in contact with the first-1 emission layer BEML-1 and the first charge generation layer CGL1. The present disclosure, however, is not limited thereto, and the first middle electron transport region may further include a first middle electron-side additional layer disposed between the first middle electron transport layer METL1 and the first-1 emission layer BEML-1. The first middle electron-side additional layer may include one or more selected from an electron buffer layer and a hole blocking layer. In addition, a first middle electron injection layer may be disposed between the first middle electron transport layer METL1 and the first charge generation layer CGL1.

The second stack ST2 may further include a first middle hole transport region MHTR1 that transports holes generated from the first charge generation layer CGL1 to the first-2 emission layer BEML-2 and a second middle electron transport region that transports electrons provided from the second charge generation layer CGL2 to the first-2 emission layer BEML-2.

The first middle hole transport region MHTR1 may include a first middle hole injection layer MHIL1 disposed on the first charge generation layer CGL1 and a first middle hole transport layer MHTL1 disposed on the first middle hole injection layer MHIL1. The first hole transport layer MHTL1 may be in contact with a bottom surface of the first-2 emission layer BEML-2. The present disclosure, however, is not limited thereto, and the first middle hole transport region MHTR1 may further include a first middle hole-side additional layer disposed on the first middle hole transport layer MHTL1. The first middle hole-side additional layer may include one or more selected from a hole buffer layer, an emission auxiliary layer, and an electron blocking layer.

The second middle electron transport region may include a second middle electron transport layer METL2 disposed on the first-2 emission layer BEML-2. The second middle electron transport layer METL2 may be disposed between and in contact with the first-2 emission layer BEML-2 and the second charge generation layer CGL2. The present disclosure, however, is not limited thereto, and the second middle electron transport region may further include a second middle electron-side additional layer disposed between the second middle electron transport layer METL2 and the first-2 emission layer BEML-2. The second middle electron-side additional layer may include one or more selected from an electron buffer layer and a hole blocking layer. In one or more embodiments, a second middle electron injection layer may be disposed between the second middle electron transport layer METL2 and the second charge generation layer CGL2.

The third stack ST3 may further include a second middle hole transport region MHTR2 that transports holes generated from the second charge generation layer CGL2 to the first-3 emission layer BEML-3, and a third middle electron transport region that transports electrons provided from the third charge generation layer CGL3 to the first-3 emission layer BEML-3.

The second middle hole transport region MHTR2 may include a second middle hole injection layer MHIL2 disposed on the second charge generation layer CGL2 and a second middle hole transport layer MHTL2 disposed on the second middle hole injection layer MHIL2. The second hole transport layer MHTL2 may be in contact with a bottom surface of the first-3 emission layer BEML-3. The present disclosure, however, is not limited thereto, and the second middle hole transport region MHTR2 may further include a second middle hole-side additional layer disposed on the second middle hole transport layer MHTL2. The second middle hole-side additional layer may include one or more selected from a hole buffer layer, an emission auxiliary layer, and an electron blocking layer.

The third middle electron transport region may include a third middle electron transport layer METL3 disposed on the first-3 emission layer BEML-3. The third middle electron transport layer METL3 may be disposed between and in contact with the first-3 emission layer BEML-3 and the third charge generation layer CGL3. The present disclosure, however, is not limited thereto, and the third middle electron transport region may further include a third middle electron-side additional layer disposed between the third middle electron transport layer METL3 and the first-3 emission layer BEML-3. The third middle electron-side additional layer may include one or more selected from an electron buffer layer and a hole blocking layer. In one or more embodiments, a third middle electron injection layer may be disposed between the third middle electron transport layer METL3 and the third charge generation layer CGL3.

The fourth stack ST4 may further include a third middle hole transport region MHTR3 that transports holes generated from the third charge generation layer CGL3 to the second emission layer GEML, and an electron transport region ETR that transports electrons provided from the second electrode EL2 to the second emission layer GEML.

The third middle hole transport region MHTR3 may include a third middle hole injection layer MHIL3 disposed on the third charge generation layer CGL3 and a third middle hole transport layer MHTL3 disposed on the third middle hole injection layer MHIL3. The third hole transport layer MHTL3 may be in contact with a bottom surface of the second emission layer GEML. The present disclosure, however, is not limited thereto, and the third middle hole transport region MHTR3 may further include a third middle hole-side additional layer disposed on the third middle hole transport layer MHTL3. The third middle hole-side additional layer may include one or more selected from a hole buffer layer, an emission auxiliary layer, and an electron blocking layer.

The electron transport region ETR may include an electron transport layer ETL disposed on the second emission layer GEML and an electron injection layer EIL disposed on the electron transport layer ETL. The electron transport layer ETL may be in contact with the second emission layer GEML. The present disclosure, however, is not limited thereto, and the electron transport region ETR may further include an electron-side additional layer disposed between the electron transport layer ETL and the second emission layer GEML. The electron-side additional layer may include one or more selected from an electron buffer layer and a hole blocking layer.

Figure 5B:
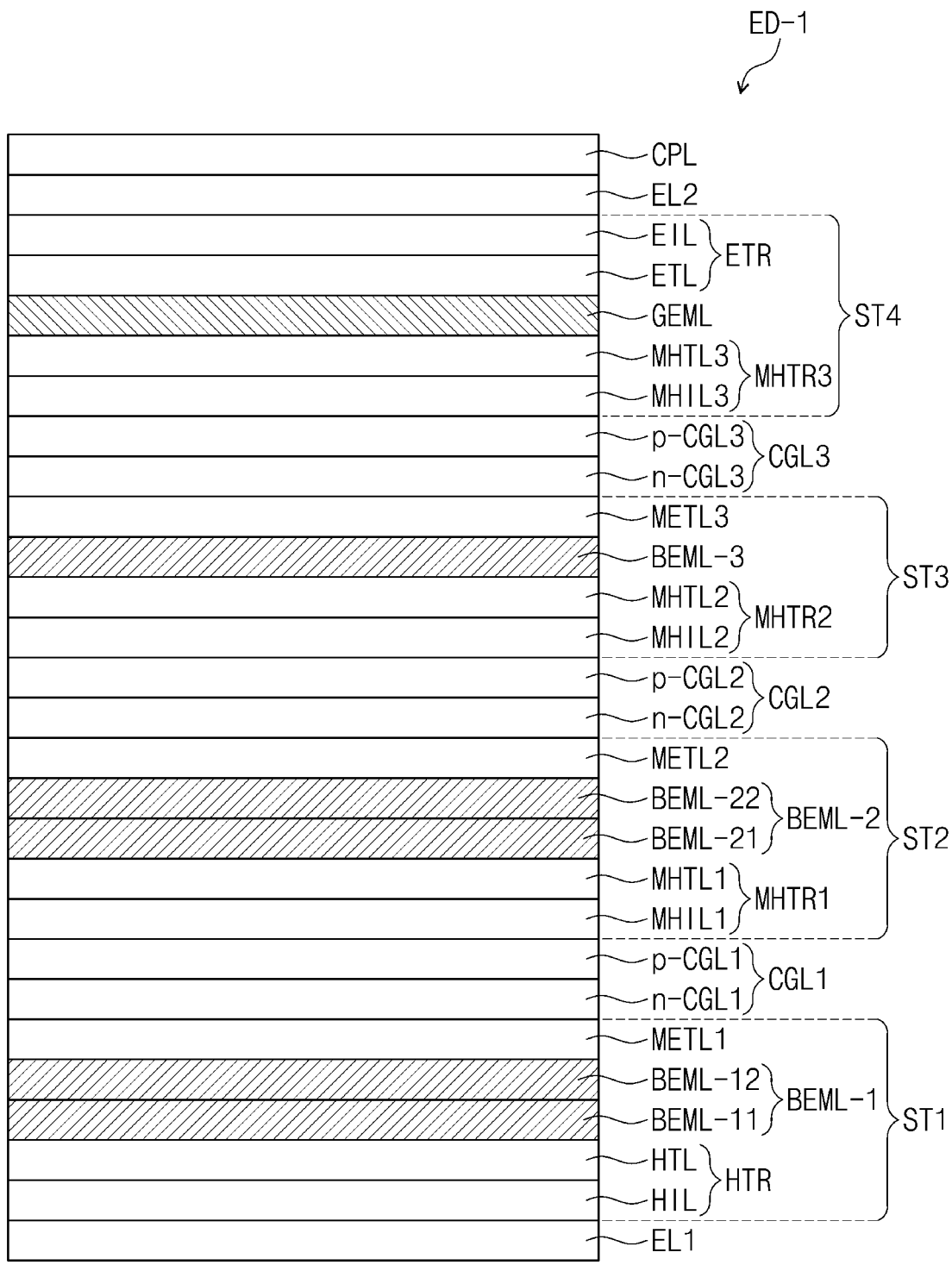

Referring to FIG. 5B, in comparison with the light emitting device ED depicted in FIG. 5A, the light emitting device ED-1 according to one or more embodiments may be configured such that at least one of a plurality of first emission layers BEML-1, BEML-2, and BEML-3 has not a bilayered structure but a monolayered structure.

As shown in FIG. 5B, one or more of the plurality of first emission layers BEML-1, BEML-2, and BEML-3 may have a bilayered structure, and a remaining one or more of the plurality of first emission layers BEML-1, BEML-2, and BEML-3 may have a monolayered structure. For example, among the plurality of first emission layers BEML-1, BEML-2, and BEML-3, the first-1 emission layer BEML-1 and the first-2 emission layer BEML-2 may have a bilayered structure as discussed above, and the first-3 emission layer BEML-3 may have not a bilayered structure but a monolayered structure. In other one or more embodiments, the first-3 emission layer BEML-3 may have a bilayered structure, and one of the first-1 emission layer BEML-1 and the first-2 emission layer BEML-2 may have a monolayered structure. In some embodiments, two of the plurality of first emission layers BEML-1, BEML-2, and BEML-3 may have a monolayered structure, and a remaining one of the plurality of first emission layers BEML-1, BEML-2, and BEML-3 may have a bilayered structure.

A monolayered first emission layer may include a single host and a single dopant. In one or more embodiments, the monolayered first emission layer may have both a hole transport host and an electron transport host. In one or more embodiments, the first-3 emission layer BEML-3 may include a hole transport host and a fluorescent dopant doped in the hole transport host. In some embodiments, the first-3 emission layer BEML-3 may include an electron transport host and a fluorescent dopant doped in the electron transport host.

The monolayered first emission layer may have a thickness of about 10 nm to about 30 nm.

Figure 5C:
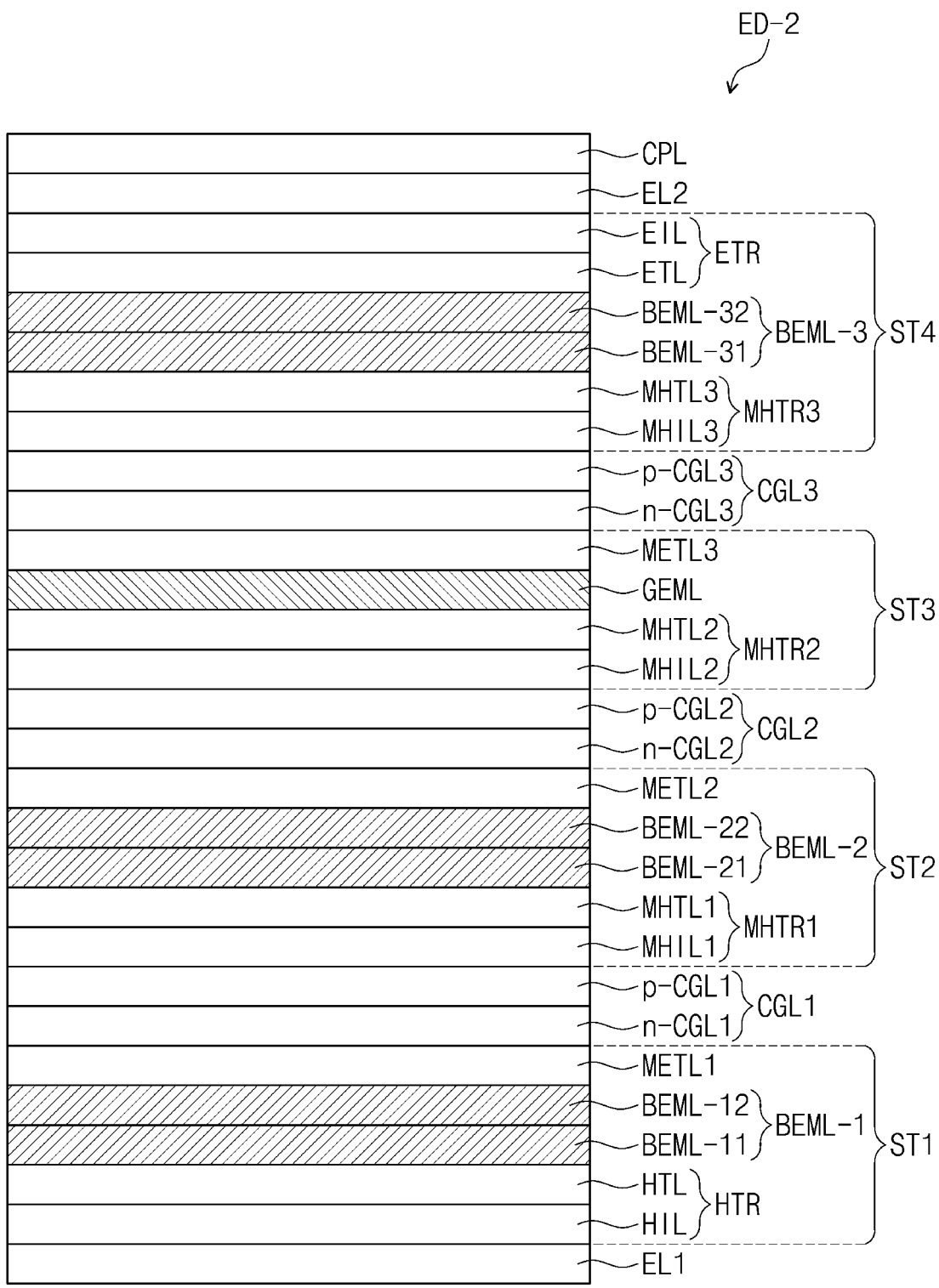
Figure 5D:
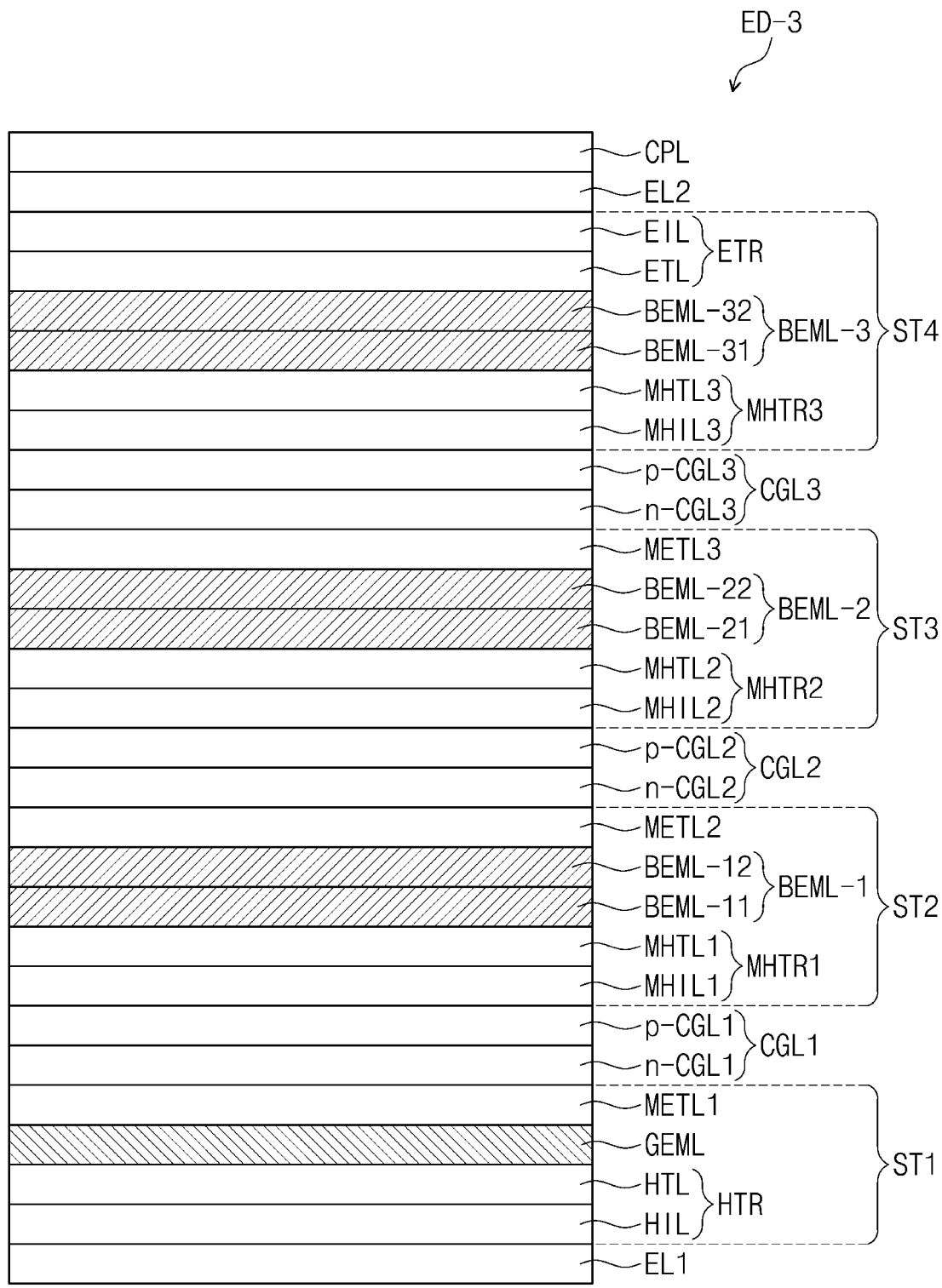

Referring to FIGS. 5C and 5D, in comparison with the light emitting device ED depicted in FIG. 5A, each of the light emitting devices ED-2 and ED-3 may be configured such that the second emission layer GEML may be included not in the fourth stack ST4 but in other stack. For example, as shown in the light emitting device ED-2 according to one or more embodiments depicted in FIG. 5C, the third stack ST3 may include the second emission layer GEML, and the first stack ST1, the second stack ST2, and the third stack ST3 may include the first-1 emission layer BEML-1, the first-2 emission layer BEML-2, and the first-3 emission layer BEML-3, respectively. For another example, as shown in the light emitting device ED-3 according to one or more embodiments depicted in FIG. 5D, the first stack ST1 may include the second emission layer GEML, and the second stack ST2, the third stack ST3, and the fourth stack ST4 may include the first-1 emission layer BEML-1, the first-2 emission layer BEML-2, and the first-3 emission layer BEML-3, respectively. In one or more embodiments, the second stack ST2 may include the second emission layer GEML, and the first stack ST1, the third stack ST3, and the fourth stack ST4 may include the first-1 emission layer BEML-1, the first-2 emission layer BEML-2, and the first-3 emission layer BEML-3, respectively.

Referring to FIGS. 5A to 5D, for the light emitting devices ED, ED-1, ED-2, and ED-3, the first electrode EL1 may have conductivity. The first electrode EL1 may be formed of a metallic material, a metal alloy, and any suitable conductive compound. The first electrode EL1 may be an anode or a cathode. The present disclosure, however, is not limited thereto. For example, the first electrode EL1 may be a pixel electrode.

For the light emitting devices ED, ED-1, ED-2, and ED-3, the first electrode EL1 may be a reflective electrode. For example, the first electrode EL1 may be or include Ag, Mg, Cu, Al, Pt, Pd, Au, Ni, Nd, Ir, Cr, Li, Ca, LiF/Ca, LiF/Al, Mo, Ti, W, In, Zn, Sn, a compound thereof, or a mixture thereof (e.g., a mixture of Ag and Mg). In one or more embodiments, the first electrode EL1 may have a multilayered structure that includes a reflection layer formed of the material discussed above and a transparent layer formed of ITO (indium tin oxide), IZO (indium zinc oxide), ZnO (zinc oxide), and/or ITZO (indium tin zinc oxide). For example, the first electrode EL1 may have a bilayered structure of ITO/Ag or a trilayered structure of ITO/Ag/ITO, but the present disclosure is not limited thereto. For another example, the first electrode EL1 may include the metallic material discussed above, any combination of two or more selected from the metallic materials discussed above, and/or any oxide of the metallic materials discussed above. The first electrode EL1 may have a thickness of about 70 nm to about 1,000 nm. For example, the first electrode EL1 may have a thickness of about 100 nm to about 300 nm.

For the light emitting devices ED, ED-1, ED-2, and ED-3 according to one or more embodiments, the hole transport region HTR and the middle hole transport regions MHTR1, MHTR2, and MHTR3 may have a monolayered structure formed of a single material, a monolayered structure formed of materials different from each other, or a multilayered structure formed of materials different from each other.

Each of the hole transport region HTR and the middle hole transport regions MHTR1, MHTR2, and MHTR3 may be formed by using one or more suitable methods such as vacuum deposition, spin coating, casting, Langmuir-Blodgett (LB), inkjet printing, laser printing, and/or laser induced thermal imaging (LITI).

The hole transport region HTR and the middle hole transport regions MHTR1, MHTR2, and MHTR3 may each independently include a phthalocyanine compound (e.g., copper phthalocyanine), DNTPD (N1,N1'-([1,1'-biphenyl]-4,4'-diyl)bis(N1-phenyl-N4,N4-di-m-tolylbenzene-1,4-diamine)), m-MTDATA (4,4',4''-[tris(3-methylphenyl)phenylamino]triphenylamine), TDATA (4,4'4''-tris(N,N-diphenylamino)triphenylamine), 2-TNATA (4,4',4''-tris[N(2-naphthyl)-N-phenylamino]-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonicacid), PANI/PSS (polyaniline/poly(4-styrenesulfonate)), NPB (N,N'-di(naphthalene-I-yl)-N,N'-diphenyl-benzidine), triphenylamine-containing polyether ketone (TPAPEK), 4-Isopropyl-4'-methyldiphenyliodonium [tetrakis(pentafluorophenyl)borate], HATCN (dipyrazino[2,3-f: 2',3'-h]quinoxaline-2,3,6,7,10,11-hexacarbonitrile).

The hole transport region HTR and the middle hole transport regions MHTR1, MHTR2, and MHTR3 may each independently include a carbazole-based derivative (such as N-phenylcarbazole and/or polyvinylcarbazole), a fluorene-based derivative, TPD (N,N'-bis(3-methylphenyl)-N,N'-diphenyl-[1,1'-biphenyl]-4,4'-diamine), triphenylamine-based derivative (such as TCTA (4,4',4''-tris(N-carbazolyl)triphenylamine)), NPB (N,N'-di(naphthalene-I-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), and/or mCP (1,3-Bis (N-carbazolyl)benzene).

In one or more embodiments, the hole transport region HTR and the middle hole transport regions MHTR1, MHTR2, and MHTR3 may each independently include CzSi (9-(4-tert-Butylphenyl)-3,6-bis(triphenylsilyl)-9H-carbazole), CCP (9-phenyl-9H-3,9'-bicarbazole), and/or mDCP (1,3-bis(1,8-dimethyl-9H-carbazol-9-yl)benzene).

The hole transport region HTR may be configured such that the above-mentioned compounds of hole transport regions may be included in one or more selected from the hole injection layer HIL, the hole transport layer HTL, and the hole-side additional layer. The middle hole transport regions MHTR1, MHTR2, and MHTR3 may be configured such that the above-mentioned compounds of hole transport regions may be included in one or more selected from the middle hole injection layers MHIL1, MHIL2, and MHIL3, the middle hole transport layers MHTL1, MHTL2, and MHTL3, and the middle hole-side additional layer.

The hole transport region HTR and the middle hole transport regions MHTR1, MHTR2, and MHTR3 may each independently have a thickness of about 10 nm to about 1,000 nm, for example, of about 10 nm to about 500 nm. For example, the hole injection layer HIL and the middle hole injection layers MHIL1, MHIL2, and MHIL3 may each independently have a thickness, for example, of about 5 nm to about 100 nm. In one or more embodiments, the hole transport layer HTL and the middle hole transport layers MHTL1, MHTL2, and MHTL3 may each independently have a thickness of about 5 nm to about 100 nm. When the hole transport region HTR includes a hole-side additional layer, the hole-side additional layer may have a thickness of about 1 nm to about 100 nm. When the middle hole transport regions MHTR1, MHTR2, and/or MHTR3 include a middle hole-side additional layer, the middle hole-side additional layer may have a thickness of about 1 nm to about 100 nm. When it is satisfied that the hole transport region HTR and the middle hole transport regions MHTR1, MHTR2, and MHTR3 have the above-mentioned thickness, and that each layer included in the hole transport region HTR and the middle hole transport regions MHTR1, MHTR2, and MHTR3 has the above-mentioned thickness, it may be possible to obtain hole transport properties satisfactory (or suitable) enough with no substantial increase in driving voltage.

The hole transport region HTR and the middle hole transport regions MHTR1, MHTR2, and MHTR3 may each independently further include a charge generation material for conductivity improvement, in addition to the materials discussed above. The charge generation material may be regularly or irregularly distributed in the hole transport region HTR and the middle hole transport regions MHTR1, MHTR2, and/or MHTR3. The charge generation material may be, for example, a p-type dopant.

The p-type dopant may include at least one selected from halogenated metal compounds, quinine derivatives, metal oxides, and cyano group-containing compounds. For example, the p-type dopant may include halogenated metal compounds (such as CuI and/or RbI), quinone derivatives (such as TCNQ (tetracyanoquinodimethane) and/or F4-TCNQ (2,3,5,6-tetrafluoro-7,7,8,8-tetracyanoquinodimethane)), and/or metal oxide (such as tungsten oxide and/or molybdenum oxide).

The first emission layers BEML-1, BEML-2, and BEML-3 and the second emission layer GEML may be provided on the hole transport region HTR or the middle hole transport regions MHTR1, MHTR2, and MHT3. The first-1 emission layer BEML-1 may be provided on the hole transport region HTR, the first-2 emission layer BEML-2 may be provided on the first middle hole transport region MHTR1, the first-3 emission layer BEML-3 may be provided on the second middle hole transport region MHTR2, and the second emission layer GEML may be provided on the third middle hole transport region MHTR3.

The first emission layers BEML-1, BEML-2, and BEML-3 and the second emission layer GEML may include a host material and a dopant that are discussed above. The first emission layers BEML-1, BEML-2, and BEML-3 and the second emission layer GEML may include a carbazole derivative moiety and/or an amine derivative moiety as a hole transport host material. The first emission layers BEML-1, BEML-2, and BEML-3 and the second emission layer GEML may include a material, as an electron transport host material, including a nitrogen-containing aromatic ring structure such as a pyridine derivative moiety, a pyridazine derivative moiety, a pyrimidine derivative moiety, a pyrazine derivative moiety, and/or triazine derivative moiety.

The first emission layers BEML-1, BEML-2, and BEML-3 and the second emission layer GEML may include a host material, such as an anthracene derivative, a pyrene derivative, a fluoranthene derivative, a chrysene derivative, a dihydro benzanthracene derivative, and/or a triphenylene derivative. In one or more embodiments, the first emission layers BEML-1, BEML-2, and BEML-3 and the second emission layer GEML may include any suitable material as a host material. For example, the first emission layers BEML-1, BEML-2, and BEML-3 and the second emission layer GEML may include, as a host material, at least one selected from DPEPO (bis[2-(diphenylphosphino)phenyl] ether oxide), CBP (4,4'-bis(carbazol-9-yl)biphenyl), mCP (1,3-bis(carbazol-9-yl)benzene), PPF (2,8-bis(diphenylphosphoryl)dibenzo[b,d]furan), TCTA (4,4',4"-tris(carbazol-9-yl)-triphenylamine), and TPBi (1,3,5-tris(1-phenyl-1H-benzo[d]imidazole-2-yl)benzene). The present disclosure, however, is not limited thereto, and the first emission layers BEML-1, BEML-2, and BEML-3 and the second emission layer GEML may include, for example, Alq$_3$ (tris(8-hydroxyquinolino)aluminum), PVK (poly(N-vinylcarbazole), AND (9,10-di(naphthalene-2-yl)anthracene), TBADN (2-tert-butyl-9,10-di(naphth-2-yl)anthracene), DSA (distyrylarylene), CDBP (4,4-bis(9-carbazolyl)-2,2-dimethyl-biphenyl), MADN (2-methyl-9,10-bis(naphthalen-2-yl)anthracene), CP1 (hexaphenyl cyclotriphosphazene), UGH2 (1,4-bis(triphenylsilyl)benzene), DPSiO3 (hexaphenylcyclotrisiloxane), and/or DPSiO4 (octaphenylcyclotetrasiloxane).

In one or more embodiments, the first emission layers BEML-1, BEML-2, and BEML-3 may include, as a fluorescent dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenz enamine (N-BDAVBi)), 4,4'-bis[2-(4-(N,N-diphenylamino)phenyl)vinyl]biphenyl (DPAVBi)), perylene and/or its derivative (e.g., 2,5,8,11-tetra-t-butylperylene (TBP)), and/or pyrene and/or its derivative (e.g., 1,1-dipyrene, 1,4-dipyrenylbenzene, 1,4-bis (N, N-diphenylamino)pyrene).

The second emission layer GEML may include a suitable phosphorescent dopant material. For example, the phosphorescent dopant material may be a metal complex including iridium (Ir), platinum (Pt), osmium (Os), gold (Au), titanium (Ti), zirconium (Zr), hafnium (Hf), europium (Eu), terbium (Tb), and/or thulium (Tm). In one or more embodiments, Flrpic (iridium(III) bis(4,6-difluorophenylpyridinato-N, C2') picolinate), Fir6 (bis(2,4-difluorophenylpyridinato)-tetrakis (1-pyrazolyl)borate iridium(III)), and/or PtOEP (platinum octaethyl porphyrin) may be used as a phosphorescent dopant material. The second emission layer GEML may include a phosphorescent dopant material to emit green color.

The electron transport region ETR and the middle electron transport region may be disposed on the first emission layers BEML-1, BEML-2, and BEML-3 and the second emission layer GEML. The electron transport region ETR and the middle electron transport region may each independently have a monolayered structure formed of a single material, a monolayered structure formed of materials different from each other, or a multilayered structure formed of materials different from each other.

Each of the electron transport region ETR and the middle electron transport region may be formed by using one or more suitable methods such as vacuum deposition, spin coating, casting, Langmuir-Blodgett (LB), inkjet printing, laser printing, and/or laser induced thermal imaging (LITI).

The electron transport region ETR and the middle electron transport region may each independently include an anthracene-based compound. The present disclosure, however, is not limited thereto, and the electron transport region ETR and the middle electron transport region may each independently include, for example, Alq$_3$ (tris(8-hydroxyquinolinato)aluminum), 1,3,5-tri[(3-pyridyl)-phen-3-yl]benzene, T2T (2,4,6-tris(3'-(pyridin-3-yl)biphenyl-3-yl)-1,3,5-triazine), 2-(4-(N-phenylbenzoimidazol-1-yl)phenyl)-9,10-dinaphthylanthracene, TPBi (1,3,5-tri(1-phenyl-1H-benzo[d]imidazol-2-yl)benzene), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato) aluminum), Bebq2 (berylliumbis(benzoquinolin-10-olate)), AND (9,10-di(naphthalene-2-yl)anthracene), BmPyPhB (1,3-bis[3,5-di(pyridin-3-yl)phenyl]benzene), or any mixture thereof.

The electron transport region ETR and the middle electron transport region may each independently include one or more selected from halogenated metal (such as LiF, NaCl, CsF, RbCl, RbI, CuI, and/or KI), lanthanide metal (such as Yb), and co-deposition materials of the halogenated metal and the lanthanide metal. For example, the electron transport region ETR and the middle electron transport region may include KI:Yb and/or RbI:Yb as the co-deposition material. The electron transport region ETR and the middle electron transport region may include Liq (8-hydroxyl-Lithium quinolate) and/or metal oxide (such as Li$_2$O and/or BaO), but the present disclosure is not limited thereto. The electron transport region ETR and the middle electron transport region may each independently be formed of a mixture of an electron transport material and a dielectric organometallic salt. The organometallic salt may have an energy bandgap equal to or greater than about 4 eV. For example, the organometallic salt may include metal acetate, metal benzoate, metal acetoacetate, metal acetylacetonate, and/or metal stearate.

The electron transport region ETR and the middle electron transport region may each independently further include at least one selected from BCP (2,9-dimethyl-4,7-diphenyl- 1,10-phenanthroline) and Bphen (4,7-diphenyl-1,10-phenanthroline), in addition to the material discussed above.

The electron transport region ETR may be configured such that the above-mentioned compounds of electron transport regions are included in the electron injection layer EIL or the electron transport layer ETL. When the electron transport region ETR includes an electron-side additional layer, the electron-side additional layer may include the material discussed above. The middle electron transport region may be configured such that the above-mentioned compounds of electron transport regions may be included in the middle electron transport layers METL1, METL2, and METL3. The middle electron transport region may be configured such that the above-mentioned compounds may be included in the middle electron-side additional layer or the middle electron injection layer.

The electron transport region ETR and the middle electron transport region may each independently have a thickness, for example, of about 100 nm to about 150 nm. The electron transport layer ETL may have a thickness of about 0.1 nm to about 100 nm, for example, of about 0.3 nm to about 50 nm. When the thickness of the electron transport layer ETL satisfies any of the ranges discussed above, it may be possible to satisfactorily (or suitably) acquire electron transport properties with no substantial increase in driving voltage. The electron injection layer EIL may have a thickness of about 0.1 nm to about 10 nm, or about 0.3 nm to about 9 nm. When the thickness of the electron injection layer EIL satisfies any of the ranges discussed above, it may be possible to obtain electron transport properties satisfactorily (or suitably) enough with no substantial increase in driving voltage. The middle electron transport layers METL1, METL2, and METL3 included in the middle electron transport region may have a thickness of about 0.1 nm to about 100 nm, for example, about 0.1 nm to about 50 nm.

The second electrode EL2 may be provided on the electron transport region ETR. The second electrode EL2 may be a common electrode. The second electrode EL2 may be a cathode or an anode, but the present disclosure is not limited thereto. For example, the second electrode EL2 may be a cathode when the first electrode EL1 is an anode, and the second electrode EL2 may be an anode when the first electrode EL1 is a cathode.

The second electrode EL2 may be a transflective electrode or a transmissive electrode. When the second electrode EL2 is a transmissive electrode, the second electrode EL2 may be formed of transparent metal oxide, such as ITO (indium tin oxide), IZO (indium zinc oxide), ZnO (zinc oxide), and/or ITZO (indium tin zinc oxide).

When the second electrode EL2 is a transflective or reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, a compound thereof, or a mixture thereof (e.g., a mixture of AgMg, AgYb, and/or MgAg). In one or more embodiments, the second electrode EL2 may have a multilayered structure that includes a reflection layer formed of the material discussed above and a transparent layer formed of ITO (indium tin oxide), IZO (indium zinc oxide), ZnO (zinc oxide), and/or ITZO (indium tin zinc oxide). For example, the second electrode EL2 may include one of the metallic materials discussed above, any combination of two or more selected from the metallic materials discussed above, and/or oxide of the metallic materials discussed above.

In one or more embodiments, the second electrode EL2 may be connected (e.g., physically and/or electrically coupled) to an auxiliary electrode. When the second electrode EL2 is connected to an auxiliary electrode, the second electrode EL2 may decrease in resistance.

A capping layer CPL may further be disposed on the second electrode EL2 of one of the light emitting devices ED, ED-1, ED-2, and ED-3 according to one or more embodiments. The capping layer CPL may have a monolayer or a multiple layer.

In one or more embodiments, the capping layer CPL may be an organic layer or an inorganic layer. For example, when the capping layer CPL includes an inorganic material, the inorganic material may include SiON, SiNx, SiOy, alkaline metal compound (such as LiF), and/or alkaline earth metal compound (such as $MgF_2$).

For example, when the capping layer CPL includes an organic material, the organic material may include α-NPD, NPB, TPD, m-MTDATA, $Alq_3$, CuPc, TPD15 (N4,N4,N4',N4'-tetra(biphenyl-4-yl)biphenyl-4,4'-diamine), TCTA (4,4',4"-tris(carbazol sol-9-yl)triphenylamine), epoxy resin, and/or acrylate (such as methacrylate). The present disclosure, however, is not limited thereto, and the capping layer CPL may include at least one selected from the following compounds P1 to P5:

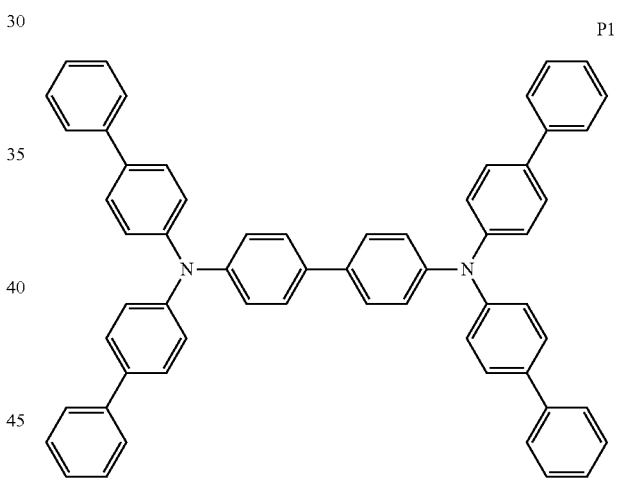

P1

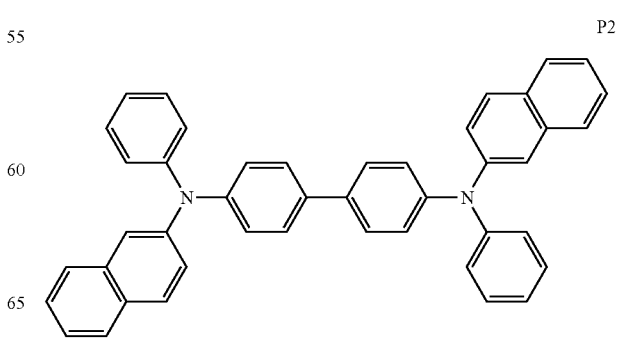

P2

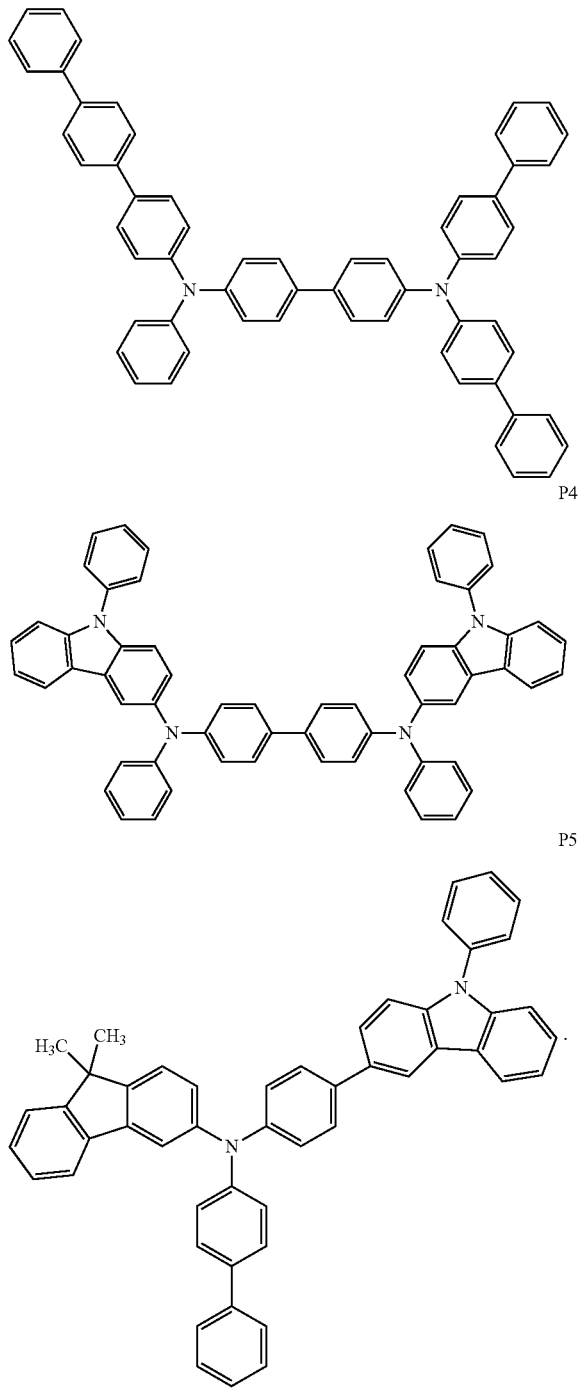

The capping layer CPL may have a refractive index equal to or greater than about 1.6. For example, the refractive index of the capping layer CPL may be equal to or greater than about 1.6 with respect to light with a wavelength in a range from about 550 nm to about 660 nm.

A light emitting device according to one or more embodiments of the present disclosure may include a first emission layer to emit light with a wavelength in a range from about 420 nm to about 480 nm, and a second emission layer to emit light with a wavelength in a range from about 520 nm to about 600 nm, and the first emission layer may have a bilayered structure in which a layer including a hole transport host is divided (e.g., separate) from a layer including an electron transport host, and a second emission layer may have a monolayered structure in which a hole transport host and an electron transport host are mixed with each other. For example, as shown in the light emitting devices ED, ED-1, ED-2, and ED-3 depicted in FIGS. 5A to 5D, the first-1 emission layer BEML-1 to emit light with a wavelength in a range from about 420 nm to about 480 nm may include the first sub-emission layer BEML-11 including a hole transport host and the second sub-emission layer BEML-12 including an electron transport host, and the second emission layer GEML to emit light with a wavelength in a range from about 520 nm to about 600 nm may have a monolayered structure in which a hole transport host and an electron transport host are mixed with each other. Accordingly, a display apparatus according to one or more embodiments of the present disclosure may have improved display efficiency and device lifespan.

For example, a light emitting device according to one or more embodiments of the present disclosure may be configured such that, when a first emission layer is a blue-light emitting layer that uses a fluorescent material, the first emission layer may have a bilayered structure in which a layer including a hole transport host and a layer including an electron transport host are divided (e.g., are separate) from each other to use (e.g., to facilitate) triplet-triplet fusion (TTF) to increase efficiency, and such that, when a first emission layer is a green-light emitting layer that uses a phosphorescent material, the first emission layer may have a monolayered structure in which a layer including a hole transport host and a layer including an electron transport host are mixed with each other to prevent or reduce a reduction in efficiency due to triplet-triplet annihilation (TTA). Accordingly, the light emitting device may exhibit a maximal (or suitable) increase in emission properties, and may prevent or reduce degradation of light emitting material and thus may increase lifespan. Moreover, it may be possible to increase display efficiency and brightness lifetime of a display apparatus including the light emitting device according to one or more embodiments.

Each of the light emitting devices ED, ED-1, ED-2, and ED-3 included in the display apparatus ES according to one or more embodiments may have a structure including a plurality of first emission layers BEML-1, BEML-2, and BEML-3 and the second emission layer GEML, and may use emission at a plurality of resonance distances and thus may maximally (or suitably) increase luminous efficiency. For example, the light emitting device ED depicted in FIG. 5A may be configured such that, in order to maximize (or improve) efficiency at a fourth resonance region of a first light with a wavelength in a range from about 420 nm to about 480 nm, the second stack ST4 is provided thereon with the second emission layer GEML to emit a second light with a wavelength in a range from about 520 nm to about 600 nm, thereby maximizing (or improving) luminous efficiency.

The following will explain property evaluation results of a light emitting device according to one or more embodiments of the present disclosure by comparing Embodiments and Comparative Examples. The embodiments discussed below are merely illustrations provided for better understanding of the present disclosure, and the present disclosure is not limited to the following embodiments.

Fabrication and Evaluation of a Light Emitting Device

For Embodiments and Comparative Examples, a tandem light emitting device is fabricated such that first, second, and third stacks are stacked and each includes a first emission layer to emit light with a wavelength in a range from about 420 nm to about 480 nm, and such that the third stack is provided thereon with a fourth stack including a second emission layer to emit light with a wavelength in a range from about 520 nm to about 600 nm. The stacks are provided therebetween with an n-type charge generation layer where Liq is doped in TPM-TAZ (2,4,6-tris(3-(pyrimidin-5-yl)phenyl)-1,3,5-triazine), and a p-type charge generation layer where Li is doped in CBP (4,4'-bis(N-carbazolyl)-1,1'-biphenyl). In one or more embodiments, ITO/Ag/ITO is used as a material for a first electrode, AgMg is used as a material for a second electrode, HATCN (1,4,5,8,9,11-hexaazatriphenylenehexacarbonitrile) is used as a material for each of a hole injection layer and a middle hole injection layer, NPB (N,N'-di(1-naphthyl)-N,N'-diphenyl-(1,1'-biphenyl)-4,4'-diamine) is used as a material for each of a hole transport layer and a hole transport layer, T2T (2,4,6-tris(biphenyl-3-yl)-1,3,5-triazine) is used as a material for a middle electron transport layer, a layer in which Liq is doped in TPM-TAZ is used as an electron transport layer, and Yb is used as a material for an electron injection layer. Each layer is formed by deposition under vacuum condition. The above-mentioned Compound P4 is used to form a capping layer having a thickness of about 70 nm on the second electrode.

For Embodiments and Comparative Examples, the above-mentioned Compound H1-5 is used as a hole transport host included in the first emission layer. The above-mentioned Compound H2-5 is used as an electron transport host included in the first emission layer. The above-mentioned Compound FD23 is used as a dopant included in the first emission layer. The above-mentioned Compound H3-4 is used as a hole transport host included in the second emission layer. The above-mentioned Compound H4-1 is used as an electron transport host included in the second emission layer. Compound PD23 is used as a dopant included in the second emission layer.

A device according to one or more embodiments is fabricated such that at least one selected from first emission layers included in the first, second, and third stacks has a bilayered structure in which a layer including a hole transport host is divided (e.g., is separate) from a layer including an electron transport host. A device according to Embodiment 1 is fabricated such that the first emission layer included in the first stack has a bilayered structure, and the first emission layers included in the second and third stacks have a monolayered structure. A device according to Embodiment 2 is fabricated such that the first emission layer included in the second stack has a bilayered structure, and the first emission layers included in the first and third stacks have a monolayered structure. A device according to Embodiment 3 is fabricated such that the first emission layer included in the third stack has a bilayered structure, and the first emission layers included in the first and second stacks have a monolayered structure. A device according to Embodiment 4 is fabricated such that all of the first emission layers included in the first, second, and third stacks have a bilayered structure. For devices according to Embodiments 1, 2, and 3, the above-mentioned Compound H2-5 is used as a host of the monolayered structure, and the above-mentioned Compound FD23 is used as a dopant of the monolayered structure.

A device according to Comparative Examples is fabricated such that all of the first emission layers included in the first, second, and third stacks have a monolayered structure. For a device according to Comparative Example 1, the first emission layer is formed to have a monolayered structure having a hole transport host and a fluorescent dopant. For a device according to Comparative Example 2, the first emission layer is formed to have a monolayered structure having an electron transport host and a fluorescent dopant.

For Embodiments and Comparative Examples, all of the second emission layers are fabricated to have a monolayered structure in which a hole transport host and an electron transport host are mixed with each other.

Table 1 below lists evaluation results of Embodiments and Comparative Examples. With regard to evaluations of light emitting devices listed in Table 1, a driving voltage is a voltage value that corresponds to brightness of about 3,500 nits. A device lifespan represents a time required to reach about 97 percent brightness of an initial brightness of a light emitting device. Driving voltage, luminous efficiency, and device lifespan exhibit relative values with respect to driving voltage, luminous efficiency, and device lifespan of Comparative 2 that serve as reference values of 100 percent.

TABLE 1

| Classification | Driving Current | Luminous Efficiency | Device Lifespan (T97) | Brightness |
|---|---|---|---|---|
| Comparative Example 1 | 108% | 77% | 70% | 3500 nits |
| Comparative Example 2 | 100% | 100% | 100% | 3500 nits |
| Embodiment 1 | 100% | 105% | 110% | 3500 nits |
| Embodiment 2 | 100% | 108% | 111% | 3500 nits |
| Embodiment 3 | 100% | 108% | 115% | 3500 nits |
| Embodiment 4 | 100% | 120% | 128% | 3500 nits |

Referring to results shown in Table 1, it may be ascertained that, in comparison with light emitting devices according to Comparative Examples, light emitting devices according to Embodiments may have low driving voltages, same brightness, high luminous efficiency, and increased device lifespan. For example, it may be ascertained that, in comparison with Comparative Examples, luminous efficiency and device lifespan are increased in Embodiment 4 in which a bilayered structure is given to all of the first emission layers included in the first, second, and third stacks. It may be found that light emitting devices according to embodiments, having the first emission layer with a bilayered structure in which a layer including a hole transport host is divided from a layer including an electron transport host, should result in the light emitting devices according to embodiments having increased luminous efficiency and device lifespan.

According to one or more embodiments of the present disclosure, a light emitting device may maximally (or suitably) increase luminous efficiency of each of a blue fluorescent layer and a green phosphorescent layer, and each of the light emitting devices may prevent or reduce damage thereto, which may further lead to an increase in luminous efficiency and device lifespan of the light emitting device.

Although embodiments of the present disclosure have been described with reference to a number of illustrative examples thereof, it will be understood by those of ordinary skill in the art that various changes in form and details may be made without departing from the spirit and scope of the present disclosure as set forth in the following claims and their equivalents. Thus, the technical scope of the present disclosure is not limited by the embodiments and examples described above, but by the following claims and their equivalents.

What is claimed is:

1. A light emitting device, comprising:
   a first electrode;
   a hole transport region on the first electrode;
   a first emission layer on the hole transport region, the first emission layer being to emit light of a first wavelength;
   a second emission layer on the hole transport region, the second emission layer being to emit light of a second wavelength different from the first wavelength;
   an electron transport region on the first emission layer and the second emission layer; and
   a second electrode on the electron transport region,
   wherein the first emission layer comprises:
      a first sub-emission layer comprising a first hole transport host and a first sub-dopant, the first sub-emission layer being to emit the light of the first wavelength; and
      a second sub-emission layer comprising a first electron transport host different from the first hole transport host and a second sub-dopant, the second sub-emission layer being to emit the light of the first wavelength, and
   wherein the second emission layer comprises a second hole transport host, a second electron transport host, and a second dopant, the second emission being to emit the light of the second wavelength.

2. The light emitting device of claim 1, wherein
   the first wavelength is in a range from about 420 nm to about 480 nm, and
   the second wavelength is in a range from about 520 nm to about 600 nm.

3. The light emitting device of claim 1, further comprising a first charge generation layer between the first emission layer and the second emission layer.

4. The light emitting device of claim 3, wherein the first charge generation layer comprises:
   a first p-type charge generation layer doped with a p-type dopant; and
   a first n-type charge generation layer doped with an n-type dopant.

5. The light emitting device of claim 1, further comprising an additional emission layer between the hole transport region and the electron transport region, the additional emission layer being to emit the light of the first wavelength.

6. The light emitting device of claim 5, wherein the additional emission layer comprises:
   a first additional emission layer between the first emission layer and the second emission layer; and
   a second additional emission layer between the first additional emission layer and the second emission layer.

7. The light emitting device of claim 6, wherein the first additional emission layer comprises:
   a third sub-emission layer comprising a second hole transport host and a third sub-dopant, the third sub-emission layer being to emit the light of the first wavelength; and
   a fourth sub-emission layer comprising a second electron transport host different from the second hole transport host and a fourth sub-dopant, the fourth sub-emission layer being to emit the light of the first wavelength.

8. The light emitting device of claim 5, wherein the additional emission layer further comprises a third additional emission layer between the second electrode and the second emission layer, the third additional emission layer being to emit the light of the first wavelength.

9. The light emitting device of claim 1, wherein the second emission layer is between the first emission layer and the second electrode.

10. The light emitting device of claim 1, wherein
    the hole transport region comprises a hole injection layer on the first electrode and a hole transport layer on the hole injection layer, and
    the electron transport region comprises an electron transport layer on the first and second emission layers and an electron injection layer on the electron transport layer.

11. The light emitting device of claim 1, further comprising a capping layer on the second electrode,
    wherein a refractive index of the capping layer is equal to or greater than about 1.6.

12. The light emitting device of claim 1, wherein
    each of the first sub-dopant and the second sub-dopant is a fluorescent dopant, and
    the second dopant is a phosphorescent dopant.

13. The light emitting device of claim 1, wherein the first sub-emission layer and the second sub-emission layer are in contact with each other.

14. The light emitting device of claim 1, further comprising:
    a middle electron transport layer on the second sub-emission layer; and
    a middle hole transport layer between the first emission layer and second emission layer.

15. A light emitting device, comprising:
    a first electrode;
    a hole transport region on the first electrode;
    a plurality of first emission layers on the hole transport region, the plurality of first emission layers being to emit light of a first wavelength;
    a second emission layer on the hole transport region, the second emission layer being to emit light of a second wavelength different from the first wavelength;
    an electron transport region on the first emission layer and the second emission layer; and
    a second electrode on the electron transport region,
    wherein the plurality of first emission layers comprise a first first-emission layer, a second first-emission layer, and a third first-emission layer,
    wherein at least one selected from the first first-emission layer, the second first-emission layer, and the third first-emission layer comprises:
       a first sub-emission layer comprising a first hole transport host and a first sub-dopant, the first sub-emission layer being to emit the light of the first wavelength; and
       a second sub-emission layer comprising a first electron transport host different from the first hole transport host and a second sub-dopant, the second sub-emission layer being to emit the light of the first wavelength.

16. The light emitting device of claim 15, wherein the second emission layer comprises a second hole transport host, a second electron transport host, and a second dopant, the second emission layer being to emit the light of the second wavelength.

17. The light emitting device of claim 15, wherein
    the first wavelength is in a range from about 420 nm to about 480 nm, and
    the second wavelength is in a range from about 520 nm to about 600 nm.

18. A display apparatus, comprising:
    a substrate comprising a first pixel region to emit light of a first wavelength, a second pixel region to emit light of a second wavelength different from the first wavelength, and a third pixel region to emit light of a third wavelength different from the first and second wavelengths; and a plurality of light emitting devices on the substrate and overlapping the first pixel region, the second pixel region, and the third pixel region, wherein each of the plurality of light emitting devices comprises:
- a first electrode;
- a hole transport region on the first electrode;
- a first emission layer on the hole transport region and to emit the light of the first wavelength;
- a second emission layer on the hole transport region and to emit the light of the second wavelength;
- an electron transport region on the first emission layer and the second emission layer; and
- a second electrode on the electron transport region, wherein the first emission layer comprises:
- a first sub-emission layer comprising a first hole transport host and a first sub-dopant, the first sub-emission layer being to emit the light of the first wavelength; and
- a second sub-emission layer comprising a first electron transport host different from the first hole transport host and a second sub-dopant, the second sub-emission layer being to emit the light of the first wavelength, and wherein the second emission layer comprises a second hole transport host, a second electron transport host, and a second dopant, the second emission layer being to emit the light of the second wavelength.

19. The display apparatus of claim 18, further comprising a light control layer on the plurality of light emitting devices, wherein the light control layer comprises:
- a first light control part that overlaps the first pixel region and is to transmit the light of the first wavelength;
- a second light control part that overlaps the second pixel region and is to transmit the light of the second wavelength; and
- a third light control part that overlaps the third pixel region and is to transmit the light of the third wavelength.

20. The display apparatus of claim 19, wherein the substrate further comprises a fourth pixel region being to emit white light, and wherein the light control layer further comprises a transmission part that overlaps the fourth pixel region and is to transmit the white light.

* * * * *